(12) United States Patent
Huang et al.

(10) Patent No.: US 12,708,039 B2
(45) Date of Patent: Aug. 11, 2026

(54) METHOD OF MANUFACTURING 3DIC PACKAGE COMPRISING A PLURALITY OF DISCRETE DEVICE DIES BONDING TO A WAFER

(71) Applicant: Taiwan Semiconductor Manufacturing Co., Ltd., Hsinchu (TW)

(72) Inventors: Ching-Yu Huang, Hsinchu (TW); Kuo-Chiang Ting, Hsinchu (TW); Ting-Chu Ko, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 626 days.

(21) Appl. No.: 18/151,609

(22) Filed: Jan. 9, 2023

(65) Prior Publication Data

US 2024/0072034 A1 Feb. 29, 2024

Related U.S. Application Data

(60) Provisional application No. 63/380,831, filed on Oct. 25, 2022, provisional application No. 63/374,029, filed on Aug. 31, 2022.

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10P 54/00* (2026.01); *H10W 40/22* (2026.01); *H10W 74/014* (2026.01); *H10W 74/114* (2026.01); *H10W 74/121* (2026.01); *H10W 70/65* (2026.01); *H10W 72/0198* (2026.01);
(Continued)

(58) Field of Classification Search
CPC ... H01L 24/02; H01L 24/05; H01L 24/08–09; H01L 25/0657; H01L 25/0652; H01L 2221/68327; H01L 21/304; H01L 2225/06541; H01L 23/5384; H01L 2225/06544; H10B 80/00; H10W 20/023; H10W 90/297; H10W 70/635;
(Continued)

(56) References Cited

U.S. PATENT DOCUMENTS

| | | | |
|---|---|---|---|
| 11,018,073 | B2 | 5/2021 | Lin et al. |
| 11,189,599 | B2 | 11/2021 | Yu et al. |

(Continued)

FOREIGN PATENT DOCUMENTS

| | | | |
|---|---|---|---|
| KR | 20190024628 | A | 3/2019 |
| KR | 20200138649 | A | 12/2020 |
| KR | 20210117138 | A | 9/2021 |

*Primary Examiner* — Didarul A Mazumder
(74) *Attorney, Agent, or Firm* — Slater Matsil, LLP

(57) ABSTRACT

A method includes bonding a first device die to a second device die through face-to-face bonding, wherein the second device die is in a device wafer, forming a gap-filling region to encircle the first device die, performing a backside-grinding process on the device wafer to reveal a through-via in the second device die, and forming a redistribution structure on the backside of the device wafer. The redistribution structure is electrically connected to the first device die through the through-via in the second device die. A supporting substrate is bonded to the first device die.

20 Claims, 27 Drawing Sheets

(51) Int. Cl.

| | |
|---|---|
| ***H10P 54/00*** | (2026.01) |
| ***H10W 40/22*** | (2026.01) |
| ***H10W 70/65*** | (2026.01) |
| ***H10W 72/00*** | (2026.01) |
| ***H10W 72/30*** | (2026.01) |
| ***H10W 72/90*** | (2026.01) |
| ***H10W 74/01*** | (2026.01) |
| ***H10W 74/10*** | (2026.01) |
| ***H10W 80/00*** | (2026.01) |
| ***H10W 90/20*** | (2026.01) |

(52) U.S. Cl.

CPC ........ *H10W 72/073* (2026.01); *H10W 72/353* (2026.01); *H10W 72/923* (2026.01); *H10W 72/941* (2026.01); *H10W 72/9415* (2026.01); *H10W 72/944* (2026.01); *H10W 72/951* (2026.01); *H10W 72/952* (2026.01); *H10W 72/953* (2026.01); *H10W 80/312* (2026.01); *H10W 80/327* (2026.01); *H10W 80/743* (2026.01); *H10W 90/297* (2026.01); *H10W 90/734* (2026.01); *H10W 90/736* (2026.01); *H10W 90/792* (2026.01)

(58) Field of Classification Search

CPC . H10W 90/736; H10W 90/288; H10W 80/00; H10W 80/312; H10W 80/327

USPC .......................................................... 257/621

See application file for complete search history.

(56) References Cited

U.S. PATENT DOCUMENTS

| | | | | |
|---|---|---|---|---|
| 11,521,959 | B2 | 12/2022 | Yu et al. | |
| 2020/0381397 | A1* | 12/2020 | Yu | H01L 24/08 |
| 2021/0118817 | A1 | 4/2021 | Wu et al. | |
| 2021/0327789 | A1 | 10/2021 | Hu et al. | |
| 2022/0262778 | A1* | 8/2022 | Yu | H01L 25/50 |

* cited by examiner 74
72
68
66
70
136
76
121'
30
50
54
22
160
162
124
20'
140
122
120'
134
154
152
132
150
144
142
130
126
120
64

96
86
122
92
162
160
88

96
94
86
122
92
90
98
162
160
88

96
86
122
92
162
160
88

180
186
185
64'
187
184
188
84
82
72
70
120'
160
20'
20'
188

METHOD OF MANUFACTURING 3DIC PACKAGE COMPRISING A PLURALITY OF DISCRETE DEVICE DIES BONDING TO A WAFER

PRIORITY CLAIM AND CROSS-REFERENCE

This application claims the benefit of the U.S. Provisional Application No. 63/380,831, filed Oct. 25, 2022, and entitled "3DIC Package and Method Forming the Same," and U.S. Provisional Application No. 63/374,029, filed Aug. 31, 2022, and entitled "SoIC F2F Structure with Stable Process Flow for High Node Die Integrated," which applications are hereby incorporated herein by reference.

BACKGROUND

Die-to-Wafer bonding and Wafer-to-wafer bonding are commonly used in the packaging of integrated circuits. For example, a plurality of discrete device dies may be bonded to a wafer. The plurality of device dies may be encapsulated in a molding compound, and redistribution lines are formed. The wafer may then be sawed apart to form discrete packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
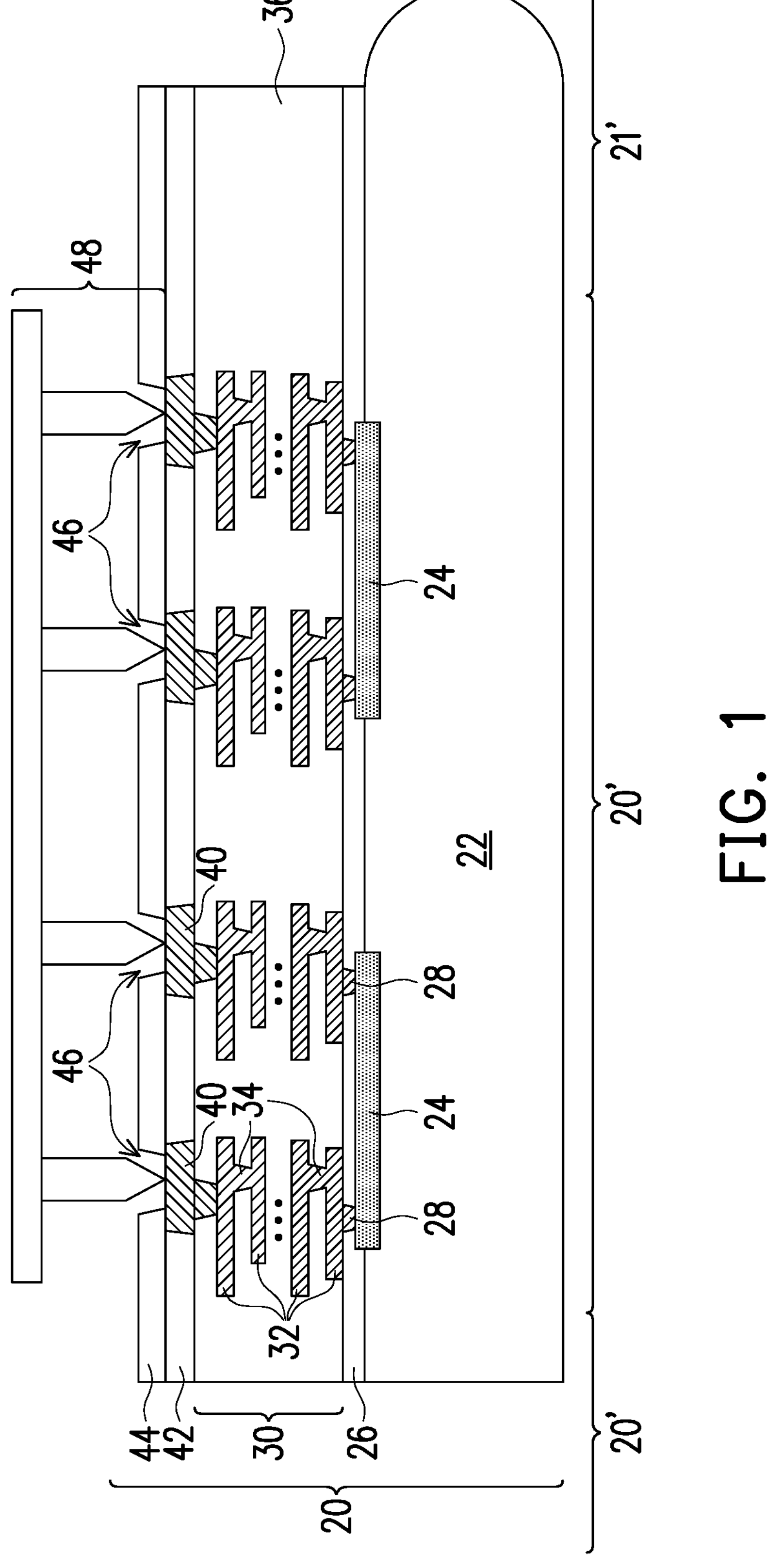
FIGS. 1 through 16 illustrate the intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided. In accordance with some embodiments, a plurality of top dies are bonded to a bottom wafer through face-to-face bonding. The bottom wafer includes bottom dies, with through-vias being formed therein. The plurality of top dies are encapsulated in a gap-filling material. The bottom wafer is polished to reveal the through-vias, and a backside interconnect structure is formed on the backside of the bottom wafer. A supporting substrate may be bonded to the top dies. A singulation process may be performed to saw the bottom wafer and the respective top dies into packages including top dies and bottom dies. By forming the redistribution structure on the backside of a bottom die, the heat generated in the top die(s) may be effectively dissipated through the supporting substrate, and the bottom die suffers less from the damage of the heat. Also, since no through-vias are formed in the top dies, the active regions available for the top dies to accommodate active devices are larger.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 16 illustrate the cross-sectional views of intermediate stages in the formation of a package in accordance with some embodiments. The corresponding processes are also reflected schematically in the process flow shown in FIG. 32.

Figure 6:
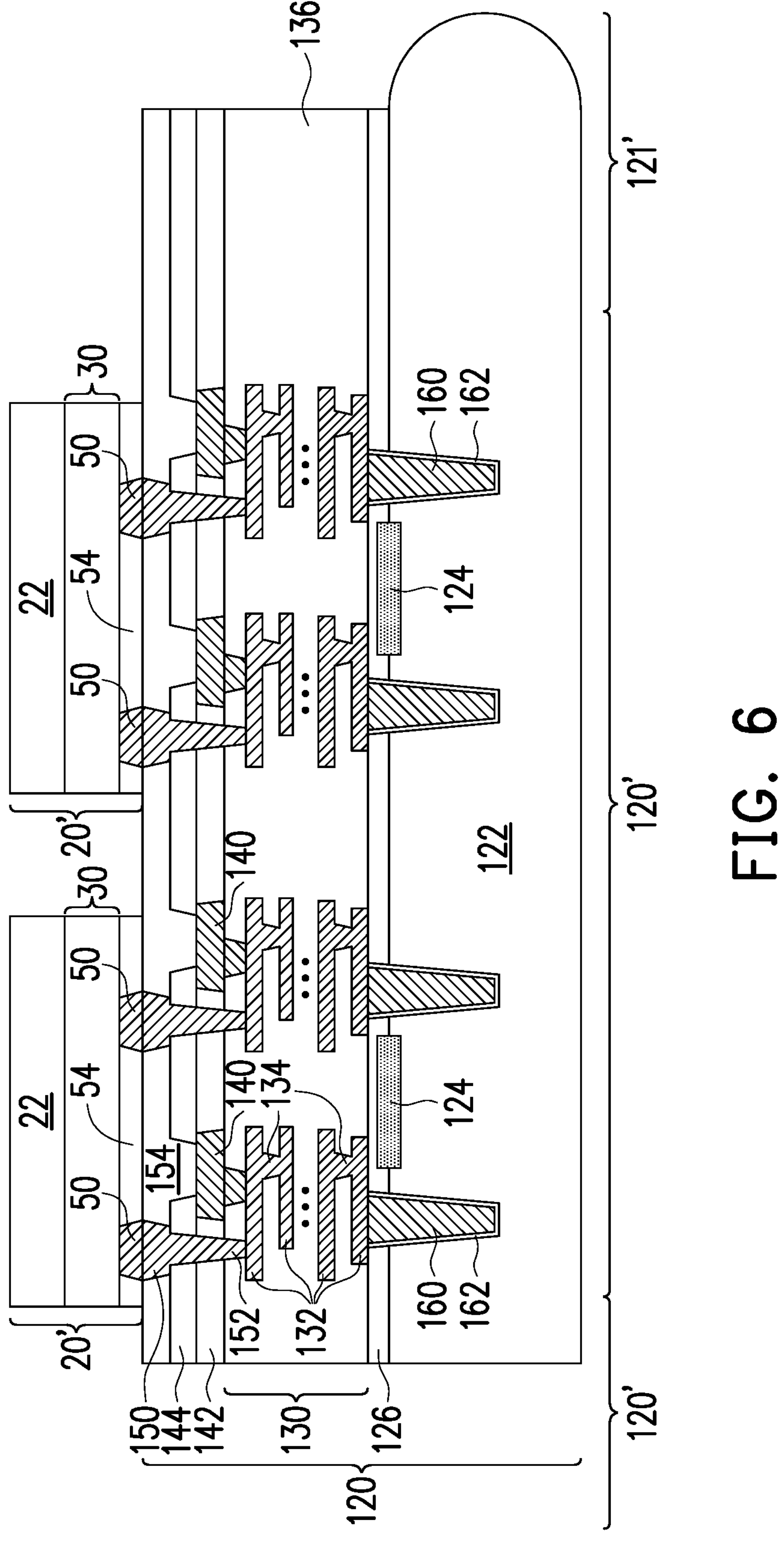

Referring to FIG. 1, device wafer 20 is formed. FIG. 1 illustrates a rightmost portion of device wafer 20, while the portions of device wafer 20 on the left side of the illustrated portions are not shown. The illustrated portion includes device dies 20' and edge region 21'. In the top view, device wafer 20 may have a round shape. Device wafer 20 may be an un-sawed wafer, and the bonding process as shown in FIG. 6 is a die-to-wafer bonding process.

In accordance with some embodiments, device wafer 20 includes substrate 22. Substrate 22 may be a semiconductor substrate such as a silicon substrate. In accordance with other embodiments, substrate 22 may include other semiconductor materials such as silicon germanium, carbon-doped silicon, or the like. Substrate 22 may be a bulk substrate, or may have a layered structure, for example, including a silicon substrate and a silicon germanium layer over the silicon substrate. Device wafer 20 may be free from through-vias formed therein.

In accordance with some embodiments, device wafer 20 includes device dies, which may include logic dies, memory dies, input-output dies, Integrated Passive Devices (IPDs), or the like, or combinations thereof. Device wafer 20 may include system-on-chip dies, each including a plurality of circuits interconnected to form a system. For example, the system-on-chip dies may include central processing units (CPU), memories, input/output circuits, and/or secondary storage circuits. Device wafer 20 may also include Graphic Processing Unit (GPU) dies, mobile application dies, Micro Control Unit (MCU) dies, BaseBand (BB) dies, Application processor (AP) dies, or the like. The memory circuits in device wafer 20 may include Static Random-Access Memories (SRAMs), Dynamic Random-Access Memories (DRAMs), or the like.

Device wafer 20 may be an un-sawed wafer including a semiconductor substrate 22 continuously extending into all device dies 20' in device wafer 20. Alternatively, device wafer 20 may be a reconstructed wafer including device dies packaged therein and encapsulated in a dielectric encapsulant. In accordance with some embodiments, integrated circuit devices 24 are formed on the top surface of semiconductor substrate 22. Example integrated circuit devices 24 may include transistors, capacitors, diodes, and/or the like. The details of integrated circuit devices 24 are not illustrated herein.

Inter-Layer Dielectric (ILD) 26 is formed over semiconductor substrate 22 and fills the space between the gate stacks of transistors (not shown) in integrated circuit devices 24. In accordance with some embodiments, ILD 26 is formed of or comprises silicon oxide, Phospho Silicate Glass (PSG), Boro Silicate Glass (BSG), Boron-Doped Phospho Silicate Glass (BPSG), Fluorine-Doped Silicate Glass (FSG), or the like. ILD 26 may be formed using Plasma-Enhanced Chemical Vapor Deposition (PECVD), spin-on coating, Flowable Chemical Vapor Deposition (FCVD), Chemical Vapor Deposition (CVD), or the like.

Contact plugs 28 are formed in ILD 26, and are used to electrically connect integrated circuit devices 24 to overlying metal lines and vias. In accordance with some embodiments, contact plugs 28 are formed of a conductive material selected from tungsten, aluminum, copper, titanium, tantalum, titanium nitride, tantalum nitride, alloys thereof, and/or multi-layers thereof. The formation of contact plugs 28 may include forming contact openings in ILD 26, filling a conductive material(s) into the contact openings, and performing a planarization process (such as a Chemical Mechanical Polish (CMP) process) to level the top surfaces of contact plugs 28 with the top surface of ILD 26.

Interconnect structure 30 are formed over ILD 26 and contact plugs 28. Interconnect structure 30 includes metal lines 32 and vias 34, which are formed in dielectric layers 36. Dielectric layers 36 may include Inter-Metal Dielectric (IMD) layers hereinafter. In accordance with some embodiments, some of dielectric layers 36 are formed of low-k dielectric materials having dielectric constant values (k-values) lower than about 3.0. Dielectric layers 36 may be formed of or comprise a carbon-containing low-k dielectric material, Hydrogen SilsesQuioxane (HSQ), MethylSilsesQuioxane (MSQ), or the like. In accordance with some embodiments, the formation of dielectric layers 36 includes depositing a porogen-containing dielectric material, and then performing a curing process to drive out the porogen, and hence the remaining dielectric layers 36 are porous.

In accordance with alternative embodiments of the present disclosure, some or all of dielectric layers 36 are formed of non-low-k dielectric materials such as silicon oxide, silicon carbide (SiC), silicon carbo-nitride (SiCN), silicon oxy-carbo-nitride (SiOCN), or the like. Etch stop layers (not shown), which may be formed of, aluminum oxide, aluminum nitride, SiON, or the like, or multi-layers thereof, are formed between dielectric layers 36, and are not shown for simplicity.

Metal lines 32 and vias 34 are formed in dielectric layers 36. The metal lines 32 at a same level are collectively referred to as a metal layer hereinafter. In accordance with some embodiments, interconnect structure 30 includes a plurality of metal layers that are interconnected through vias 34.

Metal lines 32 and vias 34 may be formed of copper or copper alloys, or be formed of other metals. The formation process may include single damascene processes and dual damascene processes. In an example single damascene process, a trench is first formed in one of dielectric layers 36, followed by filling the trench with a conductive material(s). A planarization process such as a CMP process is then performed to remove the excess portions of the conductive material(s) higher than the top surface of the IMD layer, leaving a metal line in the trench. In a dual damascene process, both of a trench and a via opening are formed in an IMD layer, with the via opening underlying and connected to the trench. The conductive material(s) is then filled into the trench and the via opening to form a metal line and a via, respectively. The conductive material(s) may include a diffusion barrier layer and a copper-containing metallic material over the diffusion barrier layer. The diffusion barrier layer may include titanium, titanium nitride, tantalum, tantalum nitride, or the like.

Dielectric layers 36 may further include passivation layers over the low-k dielectric layers. For example, there may be undoped silicate-glass (USG) layers, silicon oxide layers, silicon nitride layers, etc., over the damascene metal lines 32 and vias 34. The passivation layers are denser than the low-k dielectric layers, and have the function of isolating the low-k dielectric layers from detrimental chemicals and gases such as moisture.

In accordance with some embodiments, there may be metal pads 40 formed over interconnect structure 30, and electrically connected to integrated circuit devices 24 through metal lines 32 and vias 34. Metal pads 40 may be formed of or comprise copper, aluminum, aluminum copper, nickel, titanium, palladium, or the like, or alloys thereof.

In accordance with some embodiments, metal pads 40 are in a passivation layer 42. In accordance with some embodiments, passivation layer 42 is formed of a non-low-k dielectric material having a dielectric constant equal to or greater than the dielectric constant of silicon oxide. Passivation layer 42 may be formed of or comprise an inorganic dielectric material, which may include a material selected from, and is not limited to, silicon nitride, silicon oxide, silicon carbide, silicon oxy-nitride, silicon oxy-carbide, or the like, combinations thereof, and/or multi-layers thereof. The formation process may include LPCVD, Plasma Enhanced Chemical Vapor Deposition (PECVD), Physical Vapor Deposition (PVD), Atomic Layer Deposition (ALD), or the like. In accordance with some embodiments, the top surfaces of passivation layer 42 have portions at the same level as metal lines/pads 40.

Passivation layer 42 is patterned to form openings, through which the metal pads 40 are revealed. In accordance with some embodiments, the revealing of metal pads 40 is performed by planarizing passivation layer 42, so that the portions of passivation layer 42 over metal pads 40 are removed. The top surfaces of metal pads 40 and passivation layer 42 are thus coplanar with each other. In accordance with alternative embodiments, passivation layer 42 is patterned through an etching process, for example, using a patterned photoresist as an etching mask. Accordingly, passivation layer 42 may extend on, and covering the edge portions of, metal pads 40.

Planarization layer 44 is dispensed and then patterned, forming openings 46. Planarization layer 44 may be formed of a polymer, which may be photo-sensitive or non-photo-sensitive. The photo-sensitive polymer for forming planarization layer 44 may comprise polyimide, polybenzoxazole (PBO), benzocyclobutene (BCB), or the like. The patterning of planarization layer 44, when it is photo-sensitive, may include performing a photo-exposure process on the planarization layer 44, and then developing planarization layer 44 to form openings 46. In accordance with alternative embodiments in which planarization layer 44 is non-photo-sensitive, for example, when planarization layer 44 comprises a non-photo-sensitive epoxy/polymer, the patterning of planarization layer 44 may include applying and patterning a photoresist over the planarization layer 44, and etching the planarization layer 44 using the patterned photoresist to define patterns of openings. In accordance with alternative embodiments, planarization layer 44 may be formed of an inorganic dielectric material such as silicon oxide, silicon nitride, or the like.

Figure 32:
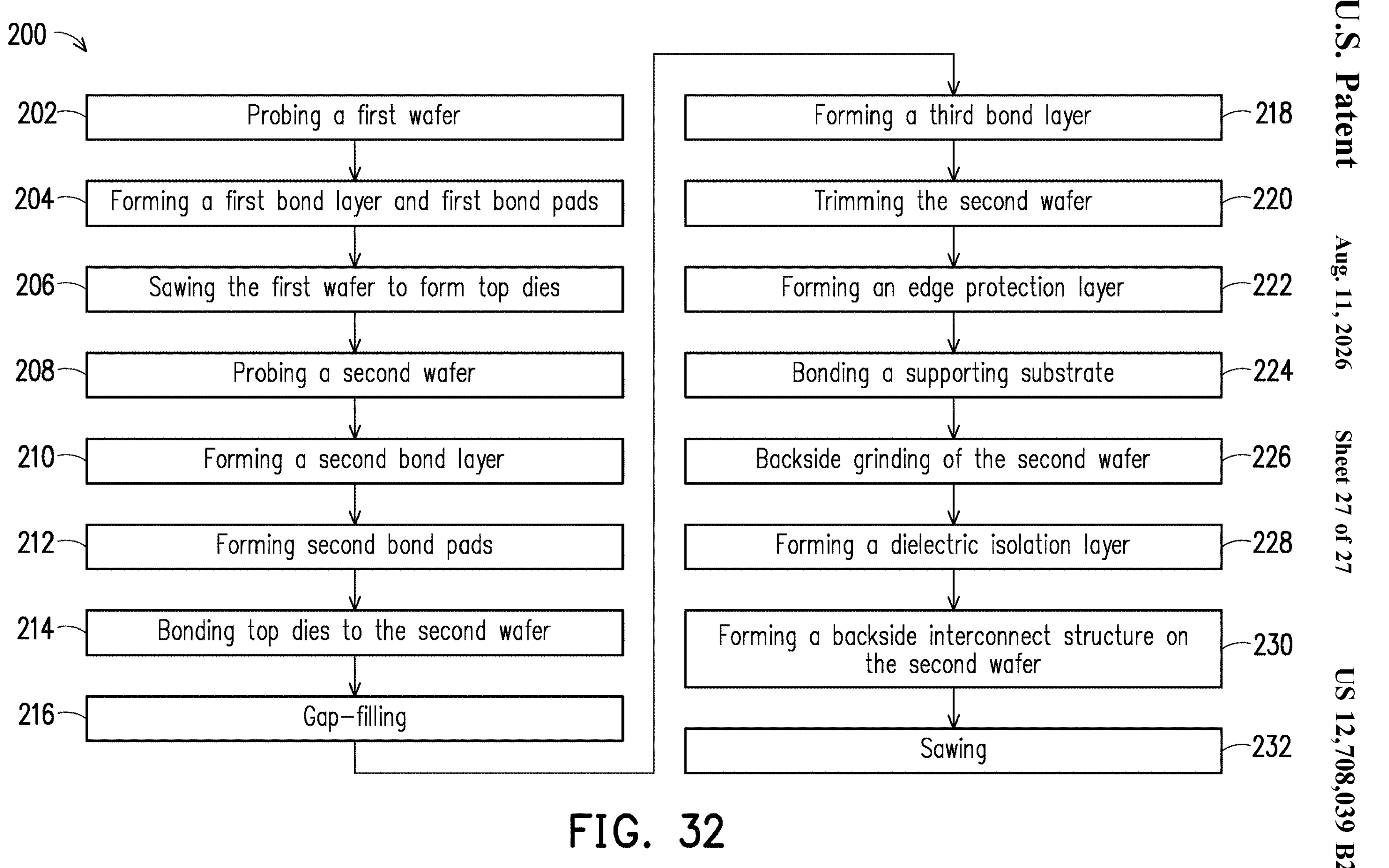
FIG. 32 illustrates a process flow for forming a package in accordance with some embodiments.

Further referring FIG. 1, a probing process is performed. The respective process is illustrated as process 202 in the process flow 200 as shown in FIG. 32. An example probing process may be performed using probe card 48, which is electrically connected to an instrument for determining the functionality of integrated circuit devices 24. The probe pins in probe card 48 are put into contact with metal pads 40 (which are also referred to as probe pads), so that currents/voltages may be provided to integrated circuit devices 24, and voltages/currents in integrated circuit devices 24 may be measured. Defective dies 20' in device wafer 20 are found through the probing process, and known-good-dies 20' are determined.

Figure 2:
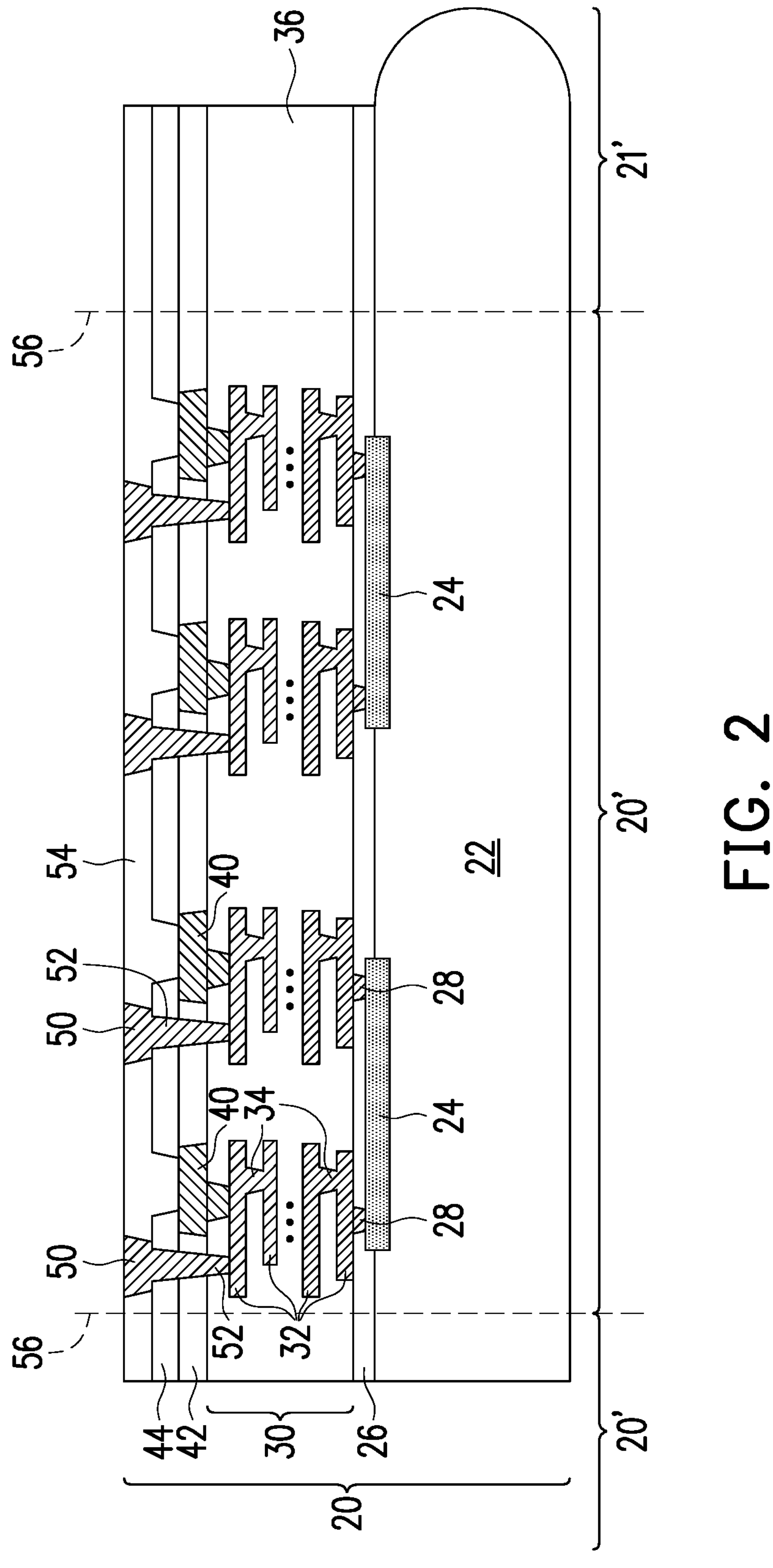

FIG. 2 illustrates the formation of bond layer 54, vias 52, and bond pads 50 in accordance with some embodiments. The respective process is illustrated as process 204 in the process flow 200 as shown in FIG. 32. Bond layer 54 may be formed of or comprise a silicon-containing dielectric material, which may be formed of or comprise silicon oxide, silicon oxynitride, silicon carbide, silicon oxycarbide, silicon nitride, and/or the like.

In accordance with some embodiments in which the bonding scheme to be used includes both of dielectric-to-dielectric bonding and metal-to-metal bonding, bond pads 50 are formed in bond layer 54. Vias 52 are also formed, and electrically connect bond pads 50 to interconnect structure 30. In accordance with some embodiments, vias 52 are landed on metal pads/lines 32 that are underlying, and possibly connected to, metal pads 40. In accordance with alternative embodiments, vias 52 are landed directly on the top surfaces of metal pads 40. The formation of bond pads 50 and vias 52 includes etching bond layer 54 and the underlying dielectric layer(s) to form openings, through which conductive features such as metal pads/lines 32 or metal pads 40 are exposed, filling the openings with conductive materials, and performing a planarization process to remove excess portions of the conductive materials higher than the top surface of bond layer 54.

Each of bond pads 50 may also include a conformal conductive barrier layer (formed of Ti, TiN, Ta, TaN, or the like), and a metallic filling material over the conductive barrier layer. The metallic filling material may be formed of or comprise copper.

In a subsequent process, wafer 20 is singulated, for example, sawed along scribe lines 56 to form discrete device dies 20'. The respective process is illustrated as process 206 in the process flow 200 as shown in FIG. 32. The known-good-dies 20', which were determined through the probing process, are selected and used in subsequent packaging processes.

Throughout the description, the side of substrate 22 having integrated circuit devices 24 is referred to as the front side of substrate 22. Accordingly, the illustrated top side of substrate 22 and wafer 20 is referred to as the front side of substrate 22 and wafer 20. The side (the illustrated bottom side) of substrate 22 and wafer 20 opposite to the front side is referred to as the backside. In accordance with some embodiments, there is no through-vias formed extending into substrate 22. Alternatively stated, in the resulting package 64' (FIG. 16), no through-vias are formed in substrate 22 to provide electrical connection from the front side to the backside of substrate 22.

Figure 3:
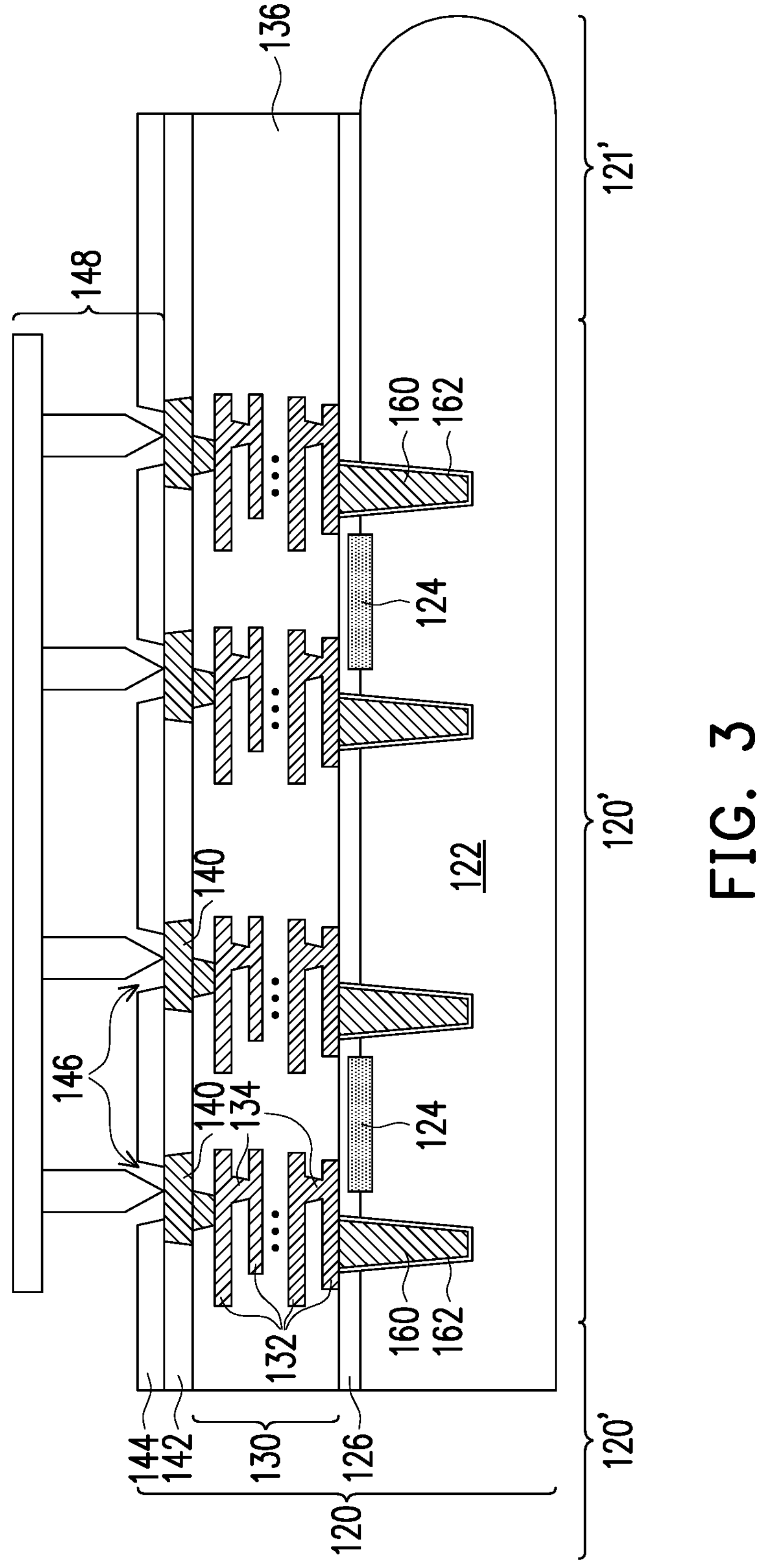
Figure 4:
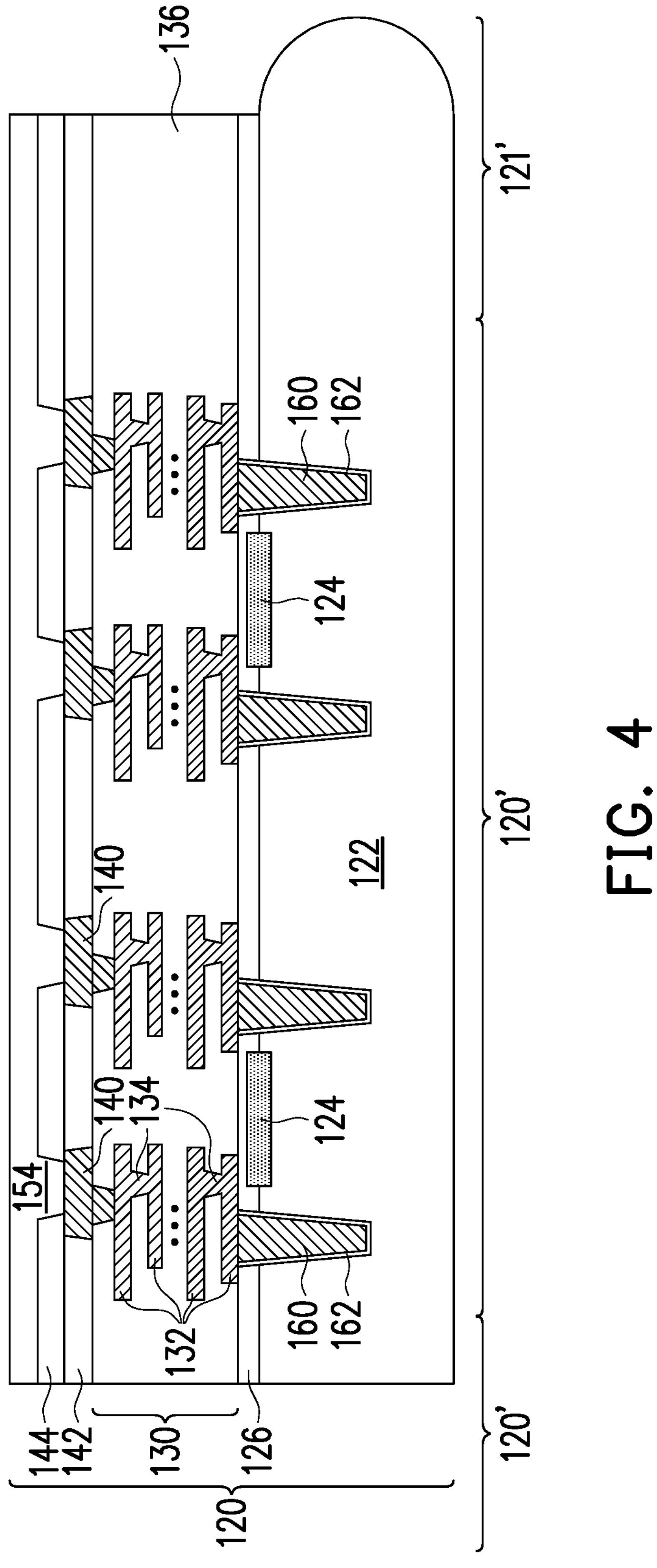

FIGS. 3 and 4 illustrate the formation and the probing of wafer 120 in accordance with some embodiments. Wafer 120 may have a structure and circuits different from the structure and the circuits of wafer 20, although the differences are not shown in figures. FIG. 3 illustrates a rightmost portion of device wafer 120 including device dies 120' and edge portion 121', while the portions of device wafer 20 on the left side of the illustrated portions are not shown. In a top view, device wafer 120 may have a round shape. In accordance with some embodiments, wafer 20 and device dies 20' (FIG. 1) are formed using an advanced technology, while wafer 120 and device dies 120' are formed using an older technology. For example, wafer 20 and device dies 20' may be formed using a 5-nm technology, 3-nm technology, or 2-nm technology, while wafer 120 and device dies 120' may be formed using 7-nm technology, 14-nm technology, 28-nm technology, or older. Accordingly, device dies 20' may generate more heat (per unit chip area) than device dies 120'. During the operation of the respective package, device dies 20' may also have a higher temperature than device dies 120' due to the heat generated during the operation of the respective package.

In accordance with some embodiments, wafer 120 is an active wafer, with integrated circuit devices 124 therein including active devices such as transistors. In accordance with alternative embodiments, wafer 120 is a passive wafer free from active devices therein. For example, integrated circuit devices 124 may include passive devices such as capacitors, inductors, resistors, and/or the like.

An example structure of device wafer 120 is discussed herein. The structures and the materials of device wafer 120 may be similar to that of device wafer 20, and the structures and the materials of device wafer 120 may be found referring to the discussion of the corresponding features in device wafer 20. The features in device wafer 120 may be similar to the corresponding features in device wafer 20 having similar reference numerals, except that the features in device wafer 120 may be marked with an additional number "1" in front. The structures and the materials of device wafer 120 may also be different from that of wafer 20.

In accordance with some embodiments, as shown in FIG. 3, device wafer 120 includes substrate 122. Through-substrate vias 160 (sometimes referred to as Through-Silicon Vias (TSVs) or Through-Semiconductor Vias (also TSVs)) extend from the front side (the illustrated top side) into substrate 122. Through-substrate vias 160 are encircled by dielectric insulation layers 162, which electrically insulate through-substrate vias 160 from substrate 122. Substrate 122 may be a semiconductor substrate such as a silicon substrate. In accordance with other embodiments, substrate 122 may include other semiconductor materials such as silicon germanium, carbon-doped silicon or the like. Substrate 122 may be a bulk substrate, or may have a layered structure, for example, including a silicon substrate and a silicon germanium layer over the silicon substrate.

In accordance with some embodiments, device wafer 120 includes device dies, which may include logic dies, memory dies, input-output dies, IPDs, or the like, or combinations thereof. The device dies in device wafer 120 may also include memory dies. Device wafer 120 may include semiconductor substrate 122 extending continuously into all device dies 120' in device wafer 120, or may be a reconstructed wafer including device dies packaged therein.

In accordance with some embodiments, integrated circuit devices 124 are formed on the top surface of semiconductor substrate 122. Example integrated circuit devices 124 may include transistors, diodes, capacitors, resistors, and/or the like. ILD 126 is formed over semiconductor substrate 122 and fills the space between the gate stacks of transistors (not shown) in integrated circuit devices 124. Contact plugs (not shown) are formed in ILD 126, and are used to electrically connect integrated circuit devices 124 to overlying metal lines and vias.

Interconnect structure 130 is formed over ILD 126 and the contact plugs. Interconnect structure 130 includes dielectric layers 136, and metal lines 132 and vias 134 formed in dielectric layers 136. Metal pads 140 are formed over interconnect structure 130, and are electrically connected to integrated circuit devices 124 through metal lines 132 and vias 134. Metal pads 140 may be formed of or comprise copper, aluminum, aluminum copper, nickel, titanium, palladium, or the like, or alloys thereof.

Passivation layer 142 is formed over interconnect structure 130. Passivation layer 142 may extend on, and covering the edge portions of, metal pads 140. Planarization layer 144 is dispensed and then patterned, forming openings 146.

Further referring FIG. 3, a probing process is performed. The respective process is illustrated as process 208 in the process flow 200 as shown in FIG. 32. The probing process may be performed using probe card 148, which is electrically connected to an instrument for determining the functionality of integrated circuit devices 124. Defective dies 120' in device wafer 120 are found through the probing process, and known-good-dies 120' are determined.

FIG. 4 illustrates the formation of bond layer 154, which may be formed of or comprise a silicon-containing dielectric material. The respective process is illustrated as process 210 in the process flow 200 as shown in FIG. 32. Bond layer 154 may be formed of or comprise silicon oxide, silicon oxynitride, silicon carbide, silicon oxycarbide, silicon nitride, or the like.

Figure 5:
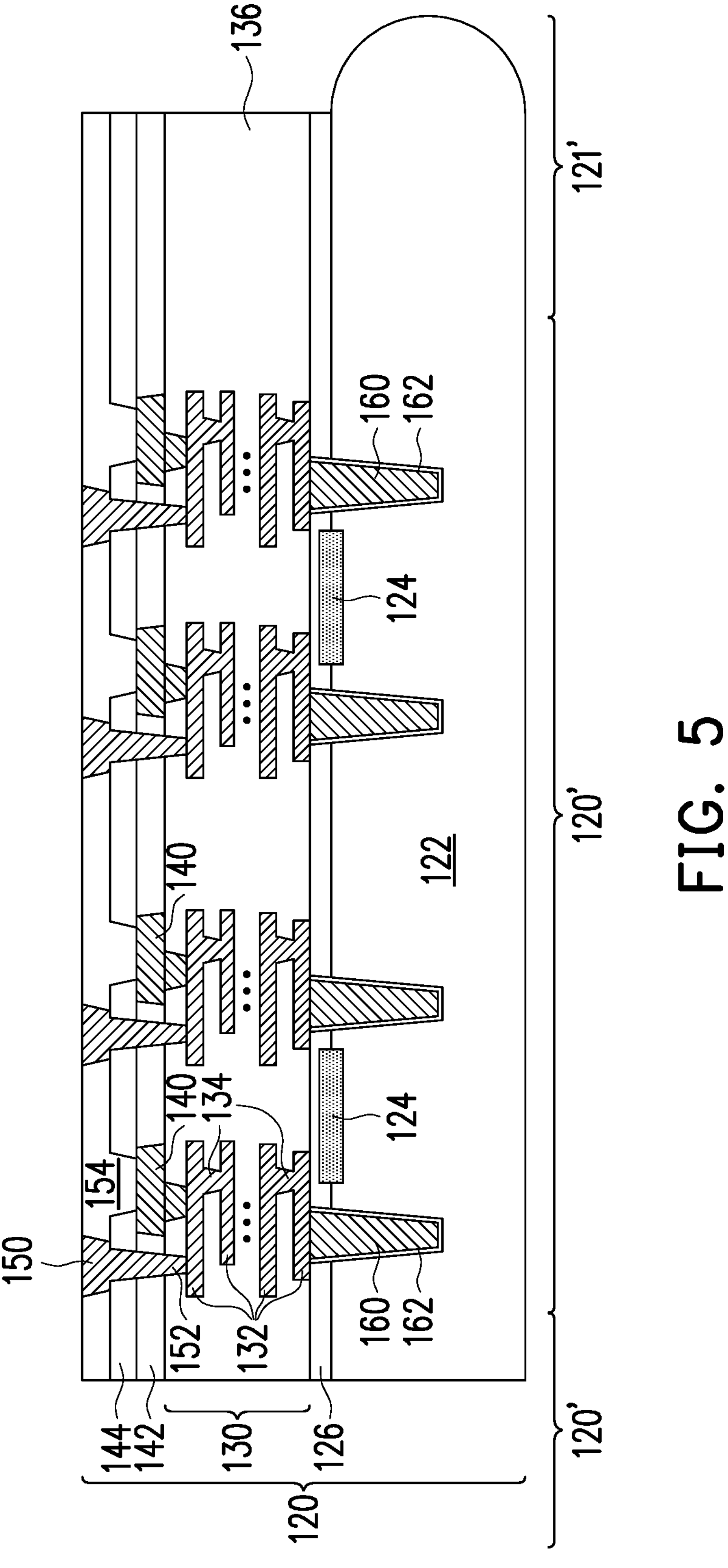

Referring to FIG. 5, bond pads 150 are formed in bond layer 154. The respective process is illustrated as process 212 in the process flow 200 as shown in FIG. 32. Vias 152 are also formed, and electrically connect bond pads 150 to interconnect structure 130. In accordance with some embodiments, vias 152 are landed on a metal pad/line 132 underlying, and possibly connected to, metal pads 140. In accordance with alternative embodiments, vias 152 are landed on the top surfaces of metal pads 140. The formation of bond pads 150 and vias 152 includes etching bond layer 154 and the underlying dielectric layer(s) to form openings, through which conductive features such as metal pads/lines 132 or metal pads 140 are exposed, filling the openings with conductive materials, and performing a planarization process to remove excess portions of the conductive materials higher than the top surface of bond layer 154.

Throughout the description, the side of substrate 122 having integrated circuit devices 124 formed is referred to as the front side of substrate 122. Accordingly, the illustrated top side of substrate 122 and wafer 120 is referred to as the front side of substrate 122 and wafer 120. The side (the illustrated bottom side) of substrate 122 and wafer 120 opposite to the front side is referred to the backside.

Referring to FIG. 6, device dies 20' are bonded to device dies 120' in wafer 120. The respective process is illustrated as process 214 in the process flow 200 as shown in FIG. 32. Through-vias 160 are thus electrically connected to integrated circuit devices 24 in device dies 20'. The bonding is performed through face-to-face bonding, wherein the front sides of device dies 20' and 120' face each other. The details of device dies 20' are not shown, and may be found referring to FIG. 2. Although two device dies 20' are illustrated as bonding to one device die 120', each device die 120' may be bonded to a single device die 20' or three or more device dies 20'. The bonding of device dies 20' to wafer 120 may be achieved through hybrid bonding, solder bonding, metal-to-metal direct bonding, or the like. The plurality of device dies 20' bonded to the same device die 120' may be identical to each other, or may have structures different from each other.

When the bonding scheme to be used includes both of dielectric-to-dielectric bonding and metal-to-metal bonding, bond pads 50 are bonded to bond pads 150 through metal-to-metal direct bonding. In accordance with some embodiments, the metal-to-metal direct bonding is or comprises copper-to-copper direct bonding. Furthermore, dielectric layers 54 and 154 are bonded to each other through dielectric-to-dielectric bonding, which may be fusion bonding. For example, Si—O—Si bonds may be generated, with Si—O bonds being in a first bond layer in bond layers 54 and 154, and Si atoms being in a second bond layer in bond layers 54 and 154.

In accordance with some embodiments, after the bonding process, a backside grinding process is performed to thin device dies 20'. Through the thinning of device dies 20', the aspect ratio of the gaps between neighboring device dies 20' is reduced in order to reduce the difficulty in the subsequent gap-filling process.

Figure 7:
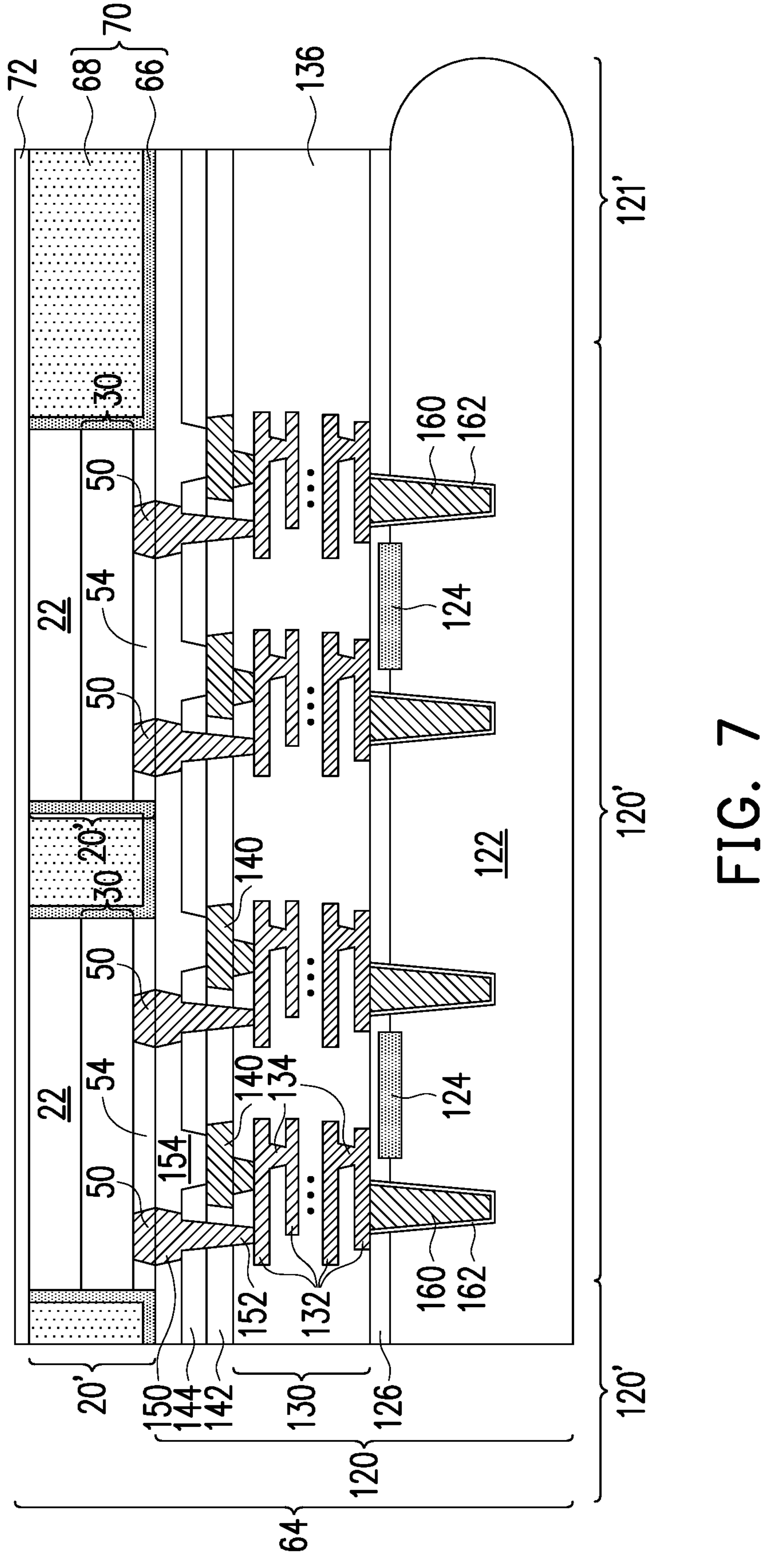

FIG. 7 illustrates the formation of gap-filling materials/layers 66 and 68, which fill the gaps between device dies 20'. The respective process is illustrated as process 216 in the process flow 200 as shown in FIG. 32. In accordance with some embodiments, the gap-filling materials/layers include dielectric liner (which also acts as an etch stop layer) 66 and dielectric layer 68. Etch stop layer 66 is formed of a dielectric material that has good adhesion to the sidewalls of device dies 20' and the top surfaces of bond layer 154. In accordance with some embodiments, etch stop layer 66 is formed of a nitride-containing material such as silicon nitride. Etch stop layer 66 may be a conformal layer. The formation of etch stop layer 66 may include a conformal deposition process such as ALD, CVD, or the like.

Dielectric layer 68 is formed of a material different from the material of etch stop layer 66. In accordance with some embodiments, dielectric layer 68 is formed of silicon oxide, while other dielectric materials such as silicon carbide, silicon oxynitride, silicon oxy-carbo-nitride, PSG, BSG, BPSG, or the like may also be used. Dielectric layer 68 may be formed using CVD, High-Density Plasma Chemical Vapor Deposition (HDPCVD), Flowable CVD, spin-on coating, or the like. Dielectric layer 68 fully fills the gaps between device dies 20'.

In accordance with alternative embodiments of the present disclosure, instead of forming etch stop layer 66 and dielectric layer 68, device die 20' is encapsulated by an encapsulant, which may be formed of molding compound, molding underfill, a resin, an epoxy, a polymer, and/or the like.

Next, a planarization process such as a CMP process or a mechanical grinding process is performed to remove excess portions of gap-filling layers 66 and 68, so that device dies 20' are exposed. The remaining portions of gap-filling layers 66 and 68 are collectively referred to as (gap-filling) isolation regions 70. Throughout the description, wafer 120 and the overlying structure are collectively referred to as reconstructed wafer 64.

Further referring to FIG. 7, bond layer 72 is deposited over device dies 20' and isolation regions 70. The respective process is illustrated as process 218 in the process flow 200 as shown in FIG. 32. In accordance with some embodiments, bond layer 72 is or comprises silicon nitride, silicon oxide, silicon carbide, silicon oxy-nitride, silicon oxy-carbide, or the like, combinations thereof, and/or multi-layers thereof. The formation process may include PECVD, ALD, CVD, or the like.

Figure 8:
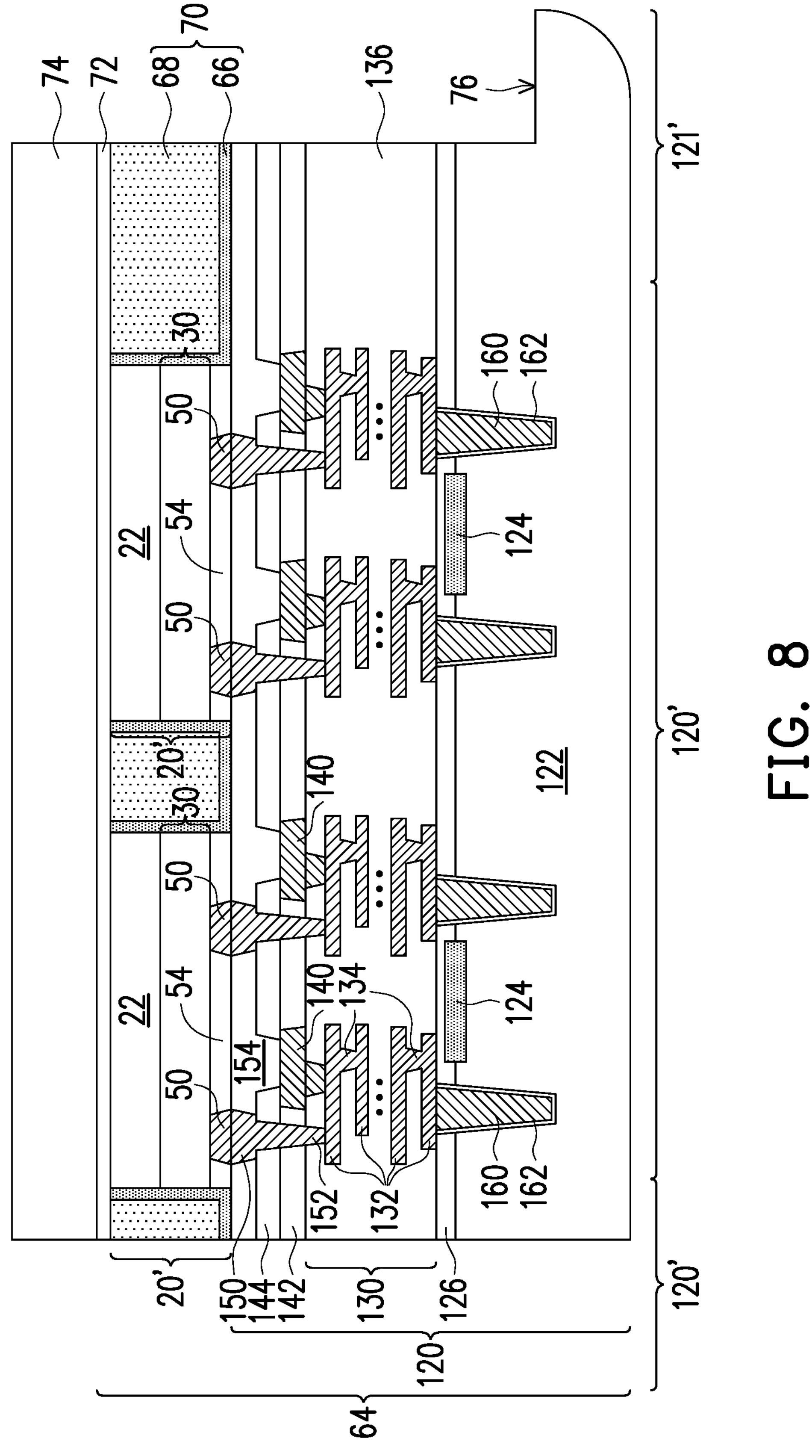

FIG. 8 illustrates an edge-trimming process in accordance with some embodiments. The respective process is illustrated as process 220 in the process flow 200 as shown in FIG. 32. In FIG. 8, protection layer 74 is first formed. Protection layer 74 may be formed of or comprise a photoresist, while other materials that may be removed easily without damaging the structure shown in FIG. 8 may be used.

In the edge-trimming process, some edge portions of reconstructed wafer 64 are removed. Recess 76 is thus generated, and extends into an edge portion of wafer 120. During the trimming process, particles, which are generated due to the grinding of the trimming wheel on the grinded portion, may fall on protection layer 74. Next, protection layer 74 is removed, for example, through an etching process, and hence the particles falling thereon are removed.

Figure 9:
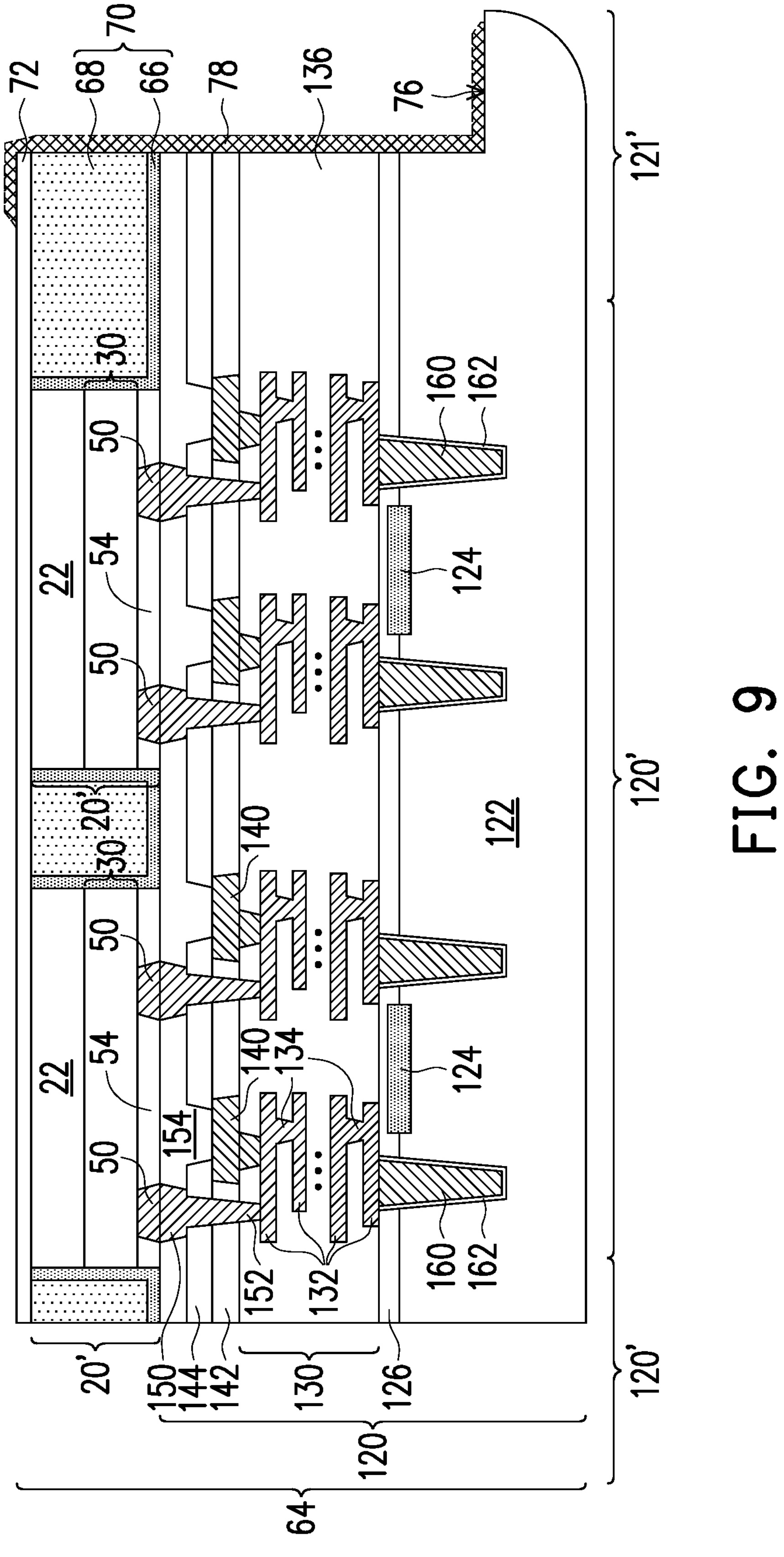

FIG. 9 illustrates the formation of edge protection layer 78 in accordance with some embodiments, which is used to protect the sidewalls of the structure. The respective process is illustrated as process 222 in the process flow 200 as shown in FIG. 32. In accordance with some embodiments, edge protection layer 78 comprises a polymer, which may include polyimide, PBO, or the like. The top portions of edge protection layer 78 on the top of bond layer 72 may then be removed, for example, in an etching process or a grinding process, while the sidewall portions of edge protection layer 78 are not removed. In accordance with alternative embodiments, edge protection layer 78 is not formed.

In accordance with alternative embodiments, the edge-trimming process as shown in FIG. 8 and the subsequent formation of edge protection layer as shown in FIG. 9 are omitted.

Figure 10:
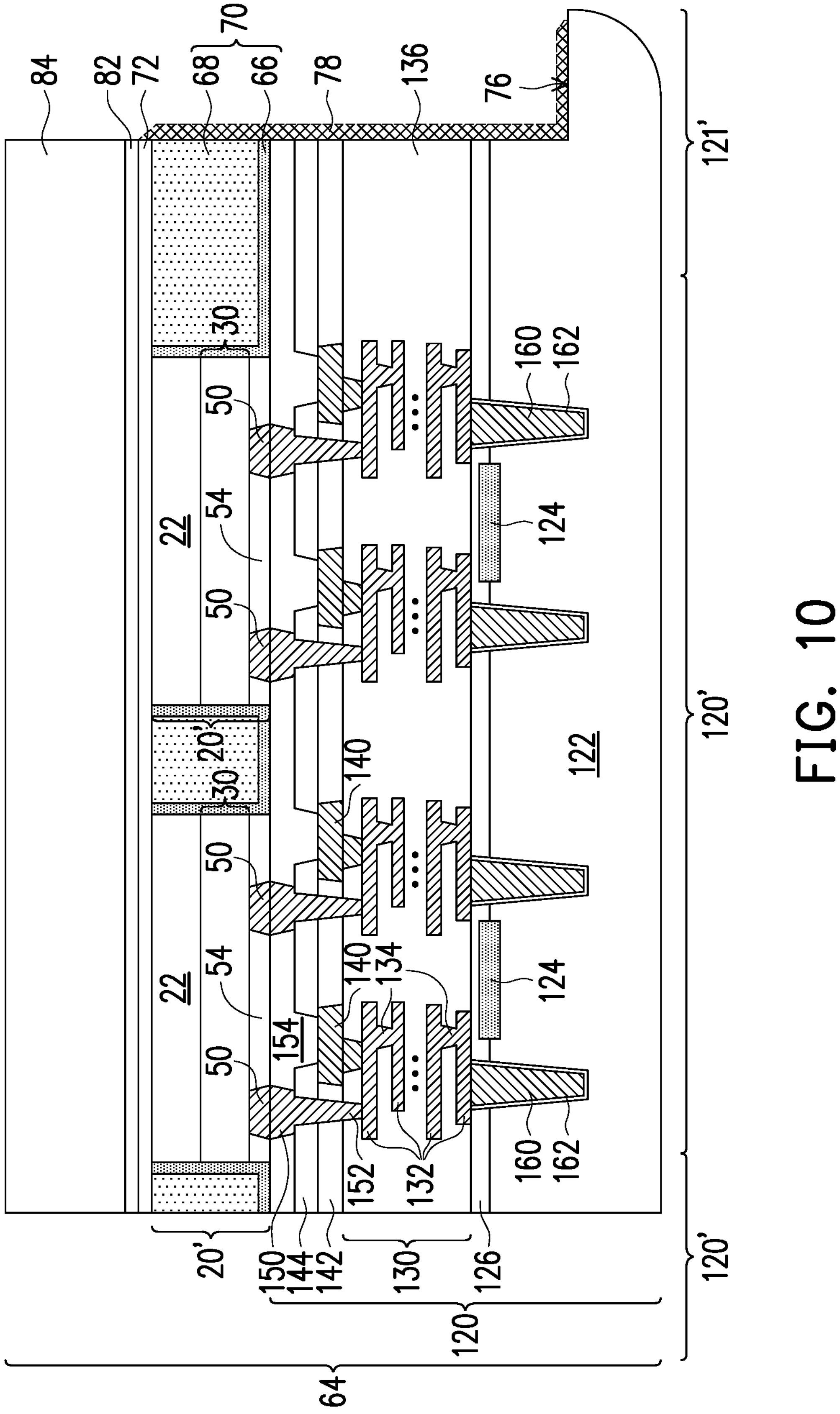

Referring to FIG. 10, supporting substrate 84 is bonded to the underlying structure to extend reconstructed wafer 64 upwardly. The respective process is illustrated as process 224 in the process flow 200 as shown in FIG. 32. Supporting substrate 84 is in wafer form, and hence is also referred to as supporting wafer 84 hereinafter. Supporting substrate 84 may be bonded to bond layer 72 through bond layer 82. In accordance with some embodiments, bond layer 82 is preformed on supporting substrate 84, for example, through a thermal oxidation process or a deposition process, and the structure including both of bond layer 82 and supporting substrate 84 are bonded to bond layer 72.

Bond layer 82 may be a silicon-containing dielectric layer formed of or comprising $SiO_2$, SiN, SiC, SiON, or the like. The deposition process may include LPCVD, PECVD, PVD, ALD, PEALD, or the like. Supporting substrate 84 may be formed of a material that has a high thermal conductivity. In accordance with some embodiments, supporting substrate 84 is a silicon substrate, while another type of substrate such as another semiconductor substrate, a dielectric substrate, a metallic substrate, or the like may be used. The entire supporting substrate 84 may be formed of a homogenous material. For example, supporting substrate 84 may be free from active and passive devices, metal lines, dielectric layers, and the like therein. When formed of a metallic material, supporting substrate 84 may be formed of or comprise nickel, copper, aluminum, or the like. The bonding of bond layer 82 to semiconductor substrate 22 may include fusion bonding.

In accordance with some embodiments, after the bonding process, supporting substrate 84 is thinned, for example, in a mechanical grinding process or a CMP process, so that the thickness of supporting substrate 84 is reduced to a proper value. Supporting substrate 84 is thus thick enough to support the subsequent grinding of wafer 120 (FIG. 12), and is not too thick.

Figure 11:
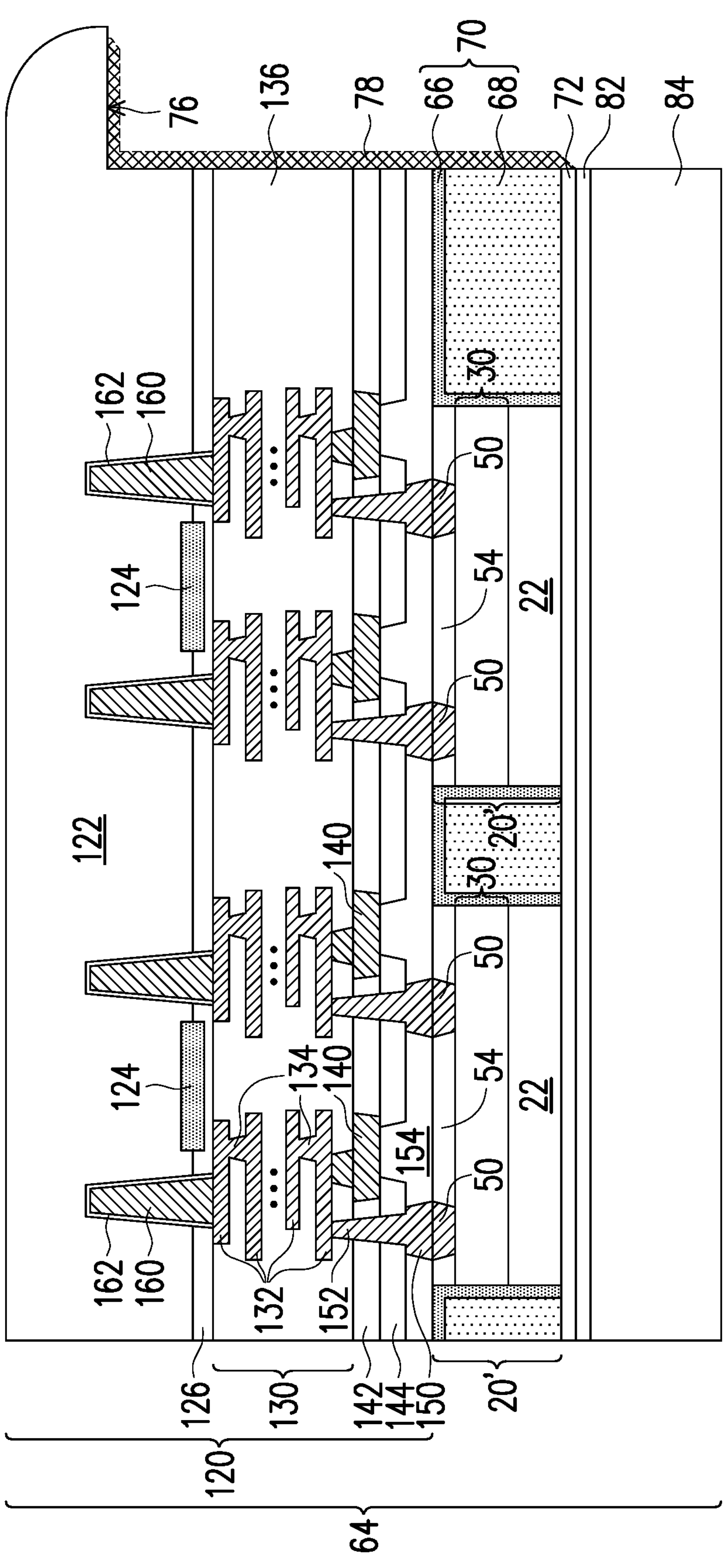

Reconstructed wafer 64 is then flipped upside down, as shown in FIG. 11. Next, as backside grinding process is performed on substrate 122. The respective process is illustrated as process 226 in the process flow 200 as shown in FIG. 32. The backside grinding process is performed until through-vias 160 are exposed. Furthermore, the portions of substrate 122 directly over recess 76 are also removed. The resulting reconstructed wafer 64 is shown in FIG. 12.

Figure 12:
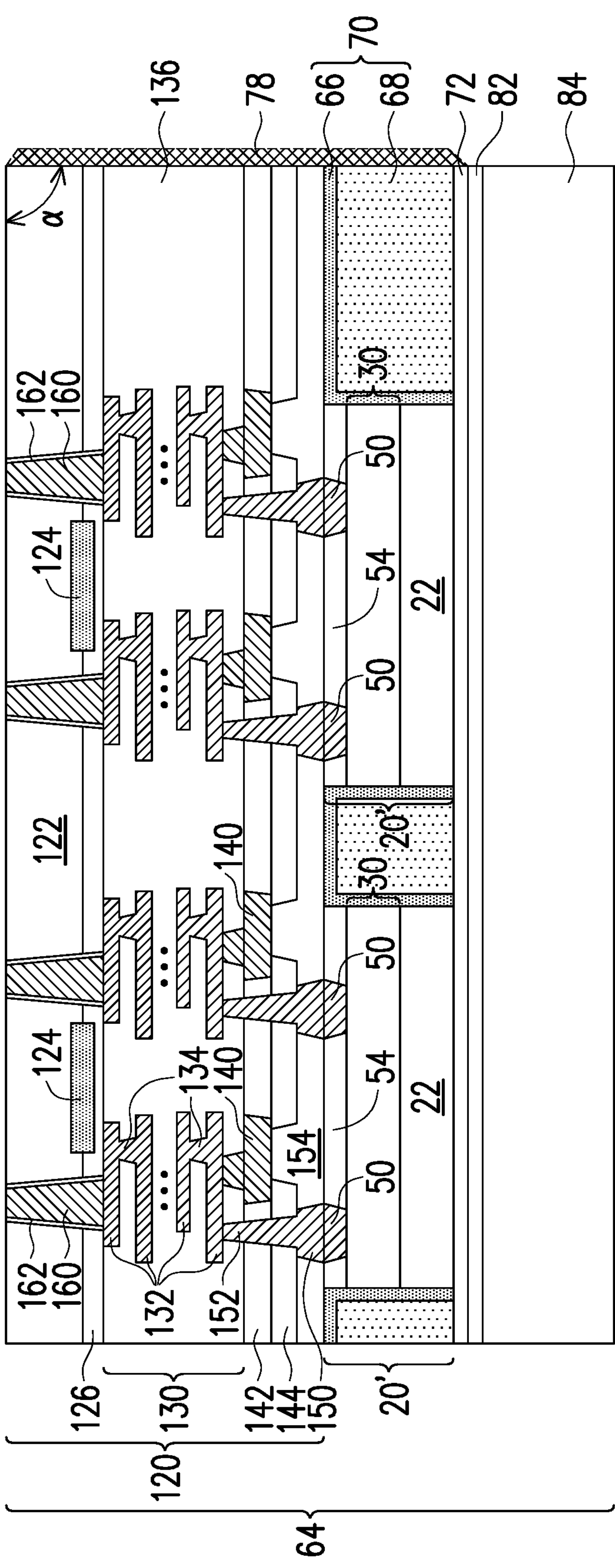

As shown in FIG. 12, due to the edge-trimming process, after the backside grinding process, the top surface and the sidewalls of semiconductor substrate 122 form a right angle $\alpha$. As a comparison, if no edge-trimming process is performed, after the backside grinding process, the top surface and the sidewalls of semiconductor substrate 122 may form acute angles due to the curved edge portions of semiconductor substrate 122. This may cause stress concentration to certain portions of wafer 120, and may cause damage. Accordingly, the edge-trimming process avoids the damage caused by the stress concentration.

In accordance with some embodiments, after through-vias 160 are exposed, semiconductor substrate 122 is slightly recessed, for example, through an etching process, so that the top portions of through-vias 160 protrude out of the recessed semiconductor substrate 122.

Figure 13:
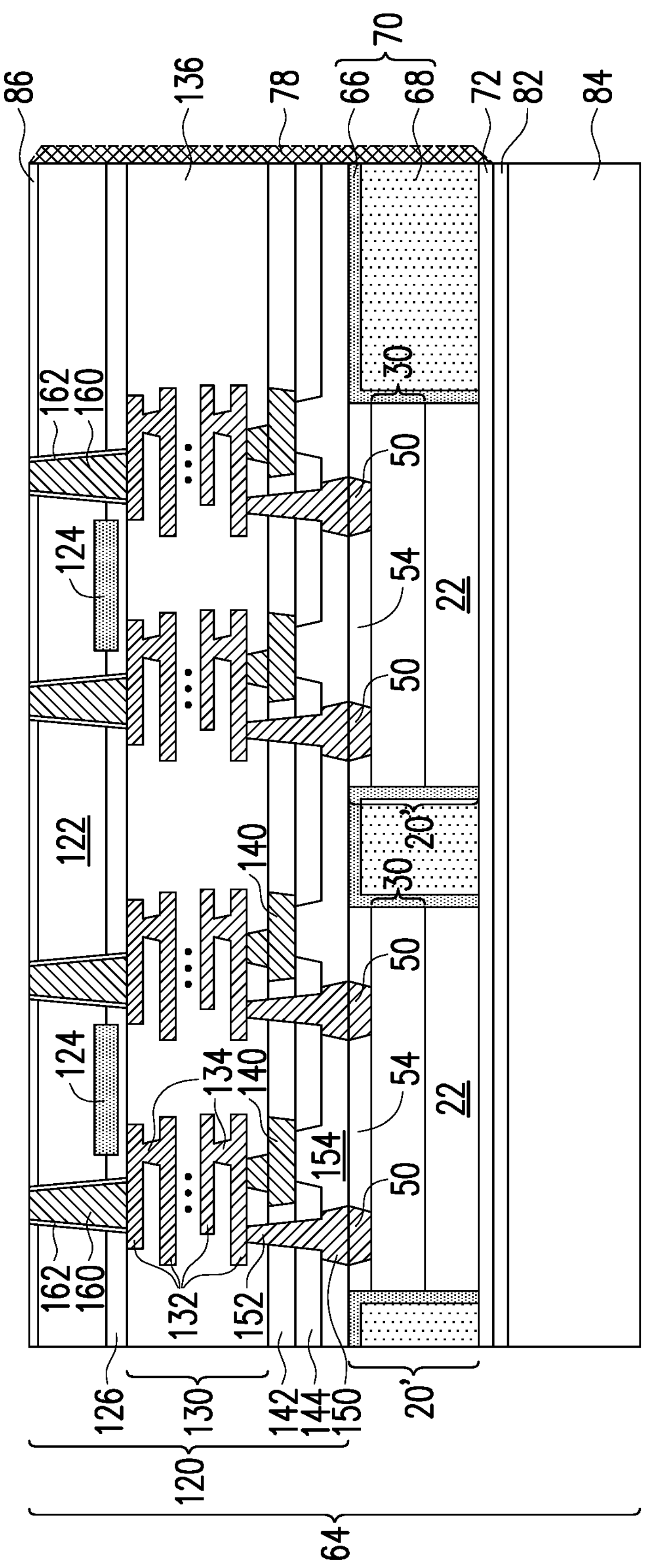

Next, as shown in FIG. 13, dielectric isolation layer 86 is formed to embed the protruding portions of through-vias 160 therein. The respective process is illustrated as process 228 in the process flow 200 as shown in FIG. 32. In accordance with some embodiments, semiconductor substrate 122 is first recessed, so that the top portions of through-vias 160 protrudes higher than the illustrated top surface of semiconductor substrate 122. Dielectric isolation layer 86 is then formed by depositing a dielectric material, which may be formed of or comprise silicon oxide, silicon nitride, or the like. A planarization process is then performed to remove the excess portions of the dielectric material over through-vias 160, so that through-vias 160 are revealed. The remaining dielectric material is dielectric layer 86.

Figure 14:
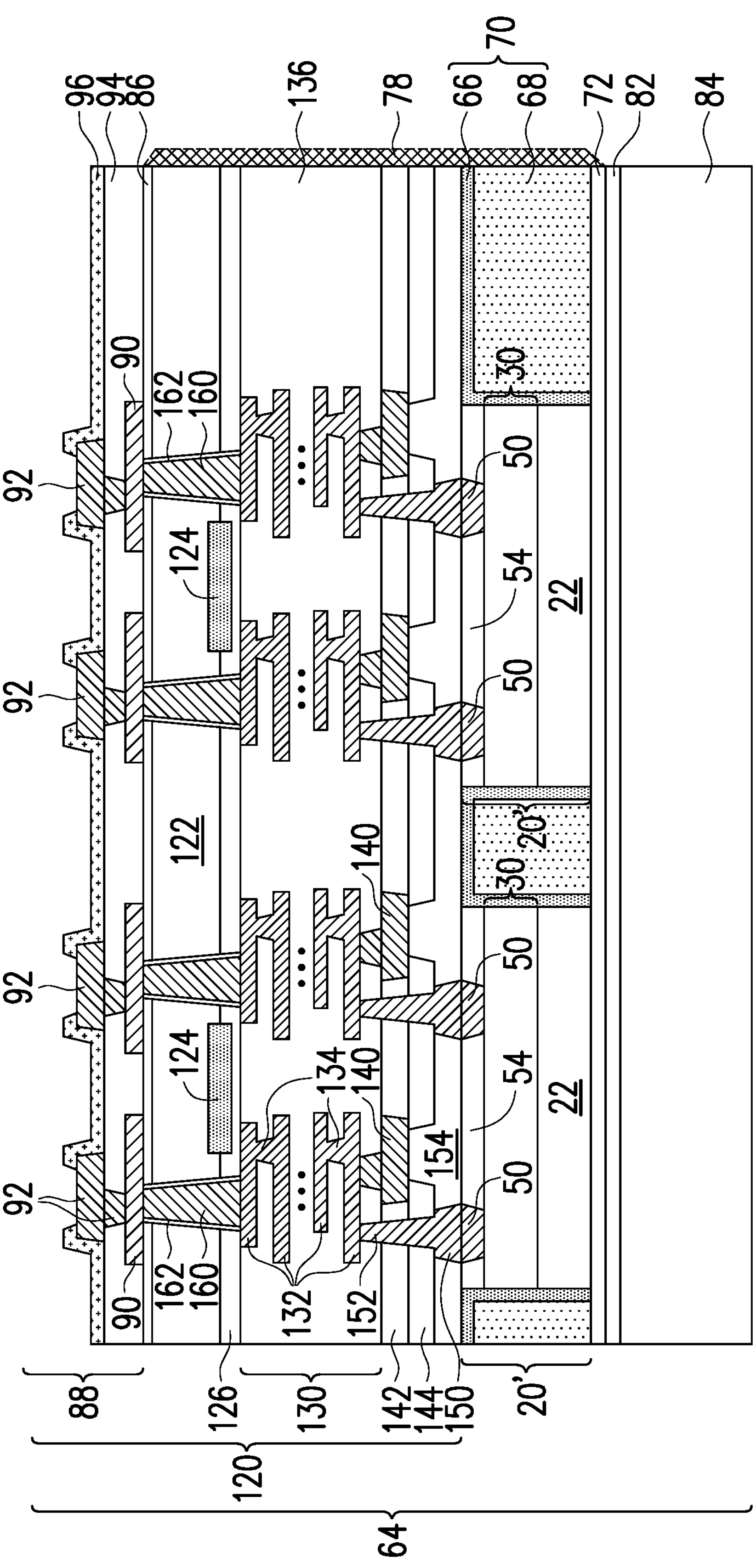
Figures 18A, 18B, 18C:
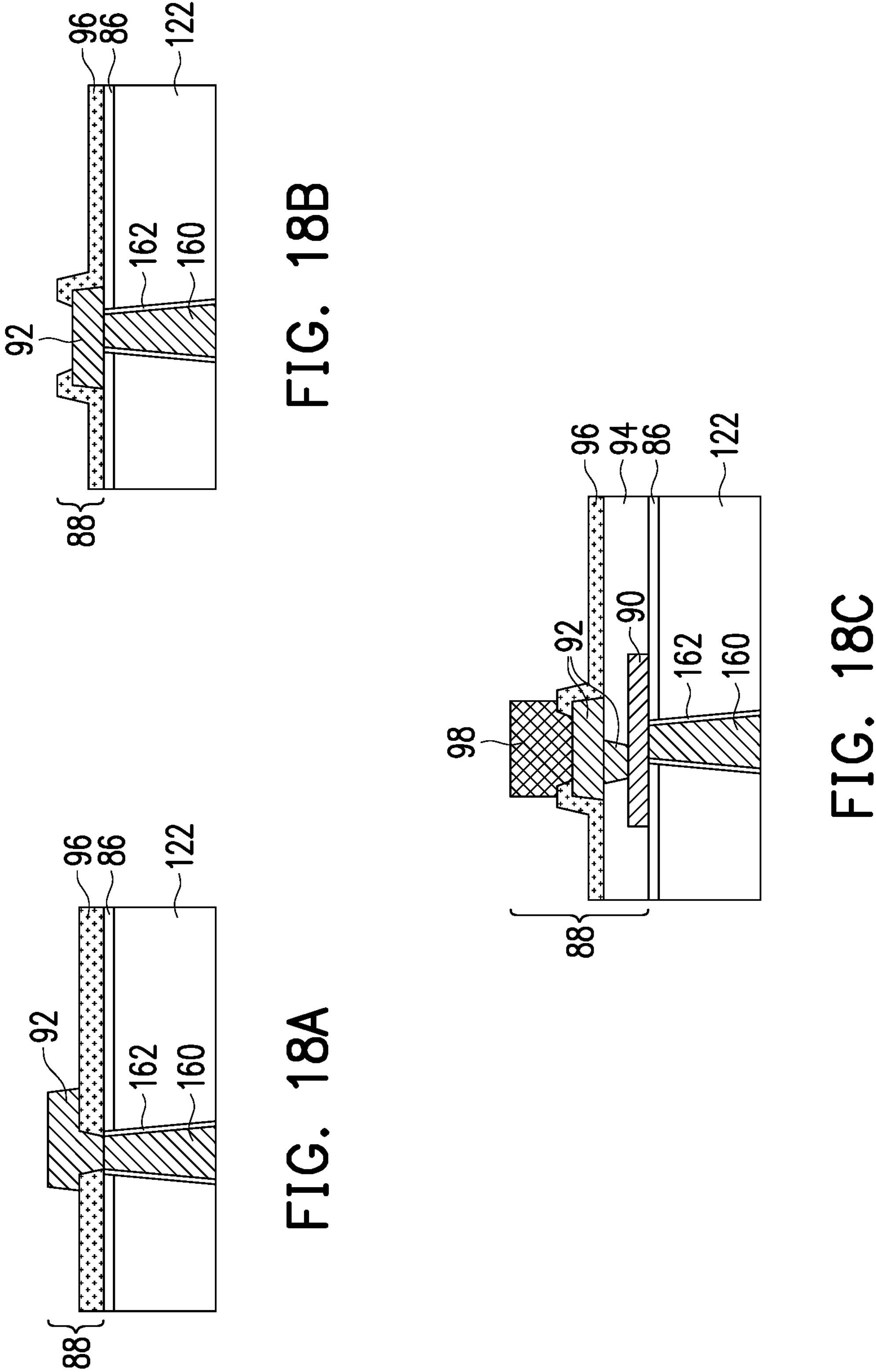
FIGS. 18A, 18B, and 18C illustrate the cross-sectional views of some backside interconnect structures in accordance with some embodiments.

Referring to FIG. 14, backside interconnect structure 88 is formed. The respective process is illustrated as process 230 in the process flow 200 as shown in FIG. 32. It is appreciated that backside interconnect structure 88 may have various structures, which are all in the scope of the present disclosure. For example, FIGS. 18A, 18B, and 18C illustrate some example structures of interconnect structure 88 in accordance with some embodiments. As shown in FIG. 14, RDLs 90 and 92 and dielectric layers 94 and 96 are formed. RDLs 90 and 92 may be formed of or comprise copper, aluminum, nickel, titanium, or the likes, or multi-layers thereof. Each of dielectric layers 94 and 96 may be formed of or comprise a inorganic material(s) and/or an organic material(s). The inorganic materials may include silicon nitride, silicon oxide, silicon carbide, silicon oxynitride, silicon oxy-carbo-nitride, or the like, combinations thereof, and/or multi-layers thereof. The organic materials may include polyamide, PBO, or the like.

Figure 15:
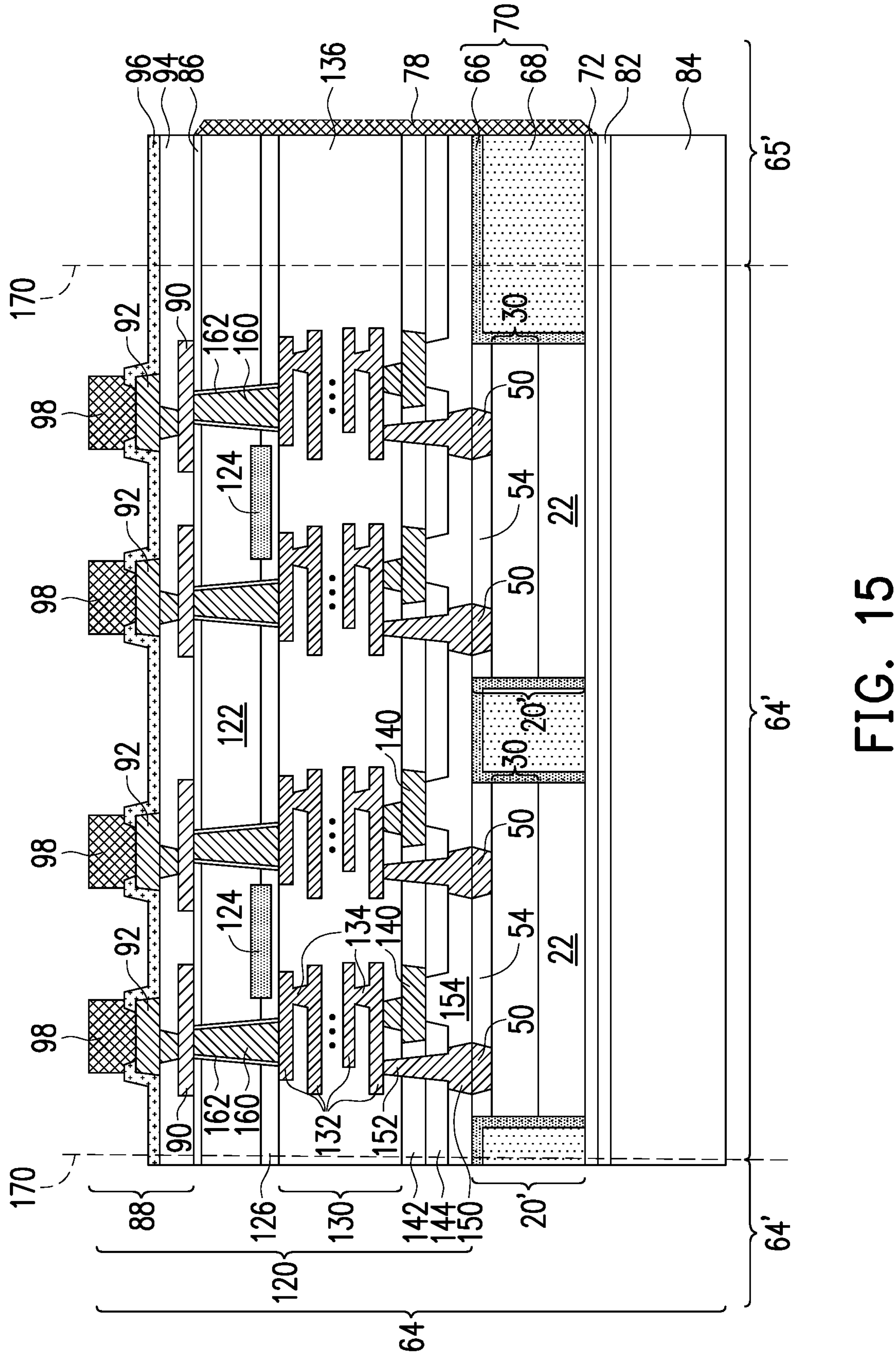

FIG. 15 illustrates the formation of conductive features 98, which are also referred to as electrical connectors 98 hereinafter. Conductive features 98 may be metal pillars, metal pads, or the like, and may or may not include solder layers.

In accordance with some embodiments, a singulation process is performed along scribe lines 170, so that reconstructed wafer 64 is sawed into a plurality of identical packages 64'. The respective process is illustrated as process 232 in the process flow 200 as shown in FIG. 32. Edge portion 65' of reconstructed wafer 64 is discarded. One of packages 64' is illustrated in FIG. 16, and is flipped upside down than what is shown in FIG. 15.

Figure 16:
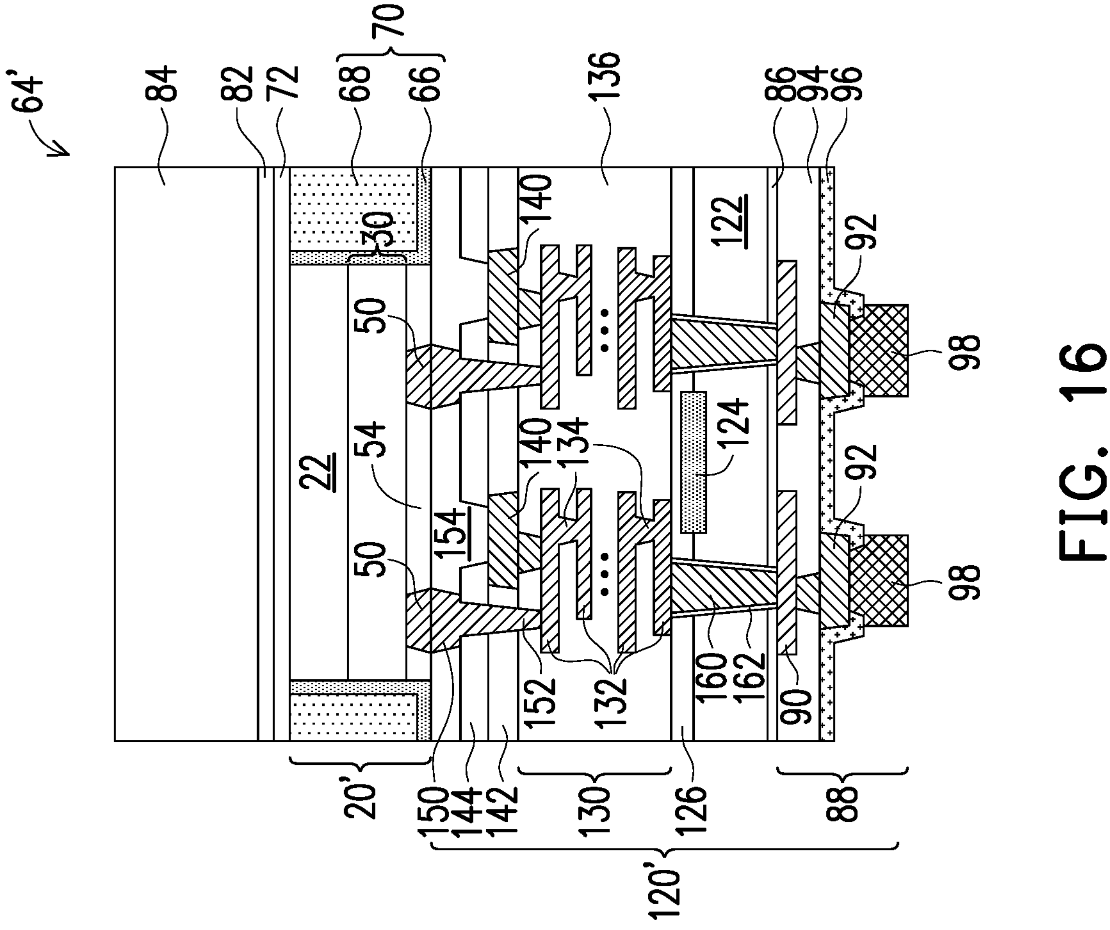

As shown in FIG. 16, each of through-vias 160 may have a wider end and a narrower end. Since the bottom side is the backside of device die 120', the wider end may be closer to the supporting substrate than the narrower end.

In accordance with some embodiments, as addressed in preceding paragraphs, device dies 20' may generate more heat, and may have a higher temperature than device dies 120' during their operations. The heat generated in device dies 20' is dissipated through supporting substrate 84 more effectively than through device die 120'. Supporting substrate 84 itself may be used as a heat sink, and/or is attached to a heat sink. With the reduction of the temperature of device dies 20' due to the effective heat-dissipation through supporting substrate 84, the temperature of device dies 20' is lowered, and less heat is dissipated through device die 120'. The temperature of device die 120' is thus reduced, and the damage of device dies 120' due to the heat is reduced. As a comparison, if heat is mainly dissipated through device die 120', device die 120' may suffer from the damage.

Furthermore, face-to-face bonding is adopted in the embodiments of the present disclosure. The backside interconnect structure 88 for electrically connecting to the integrated circuit devices in packages 64' are formed on the backside of device die 120', rather than on the front side of device dies 20'. The cost of the formation process is lower than if the connect structure is formed on the front side of device dies 20'.

Figure 17:
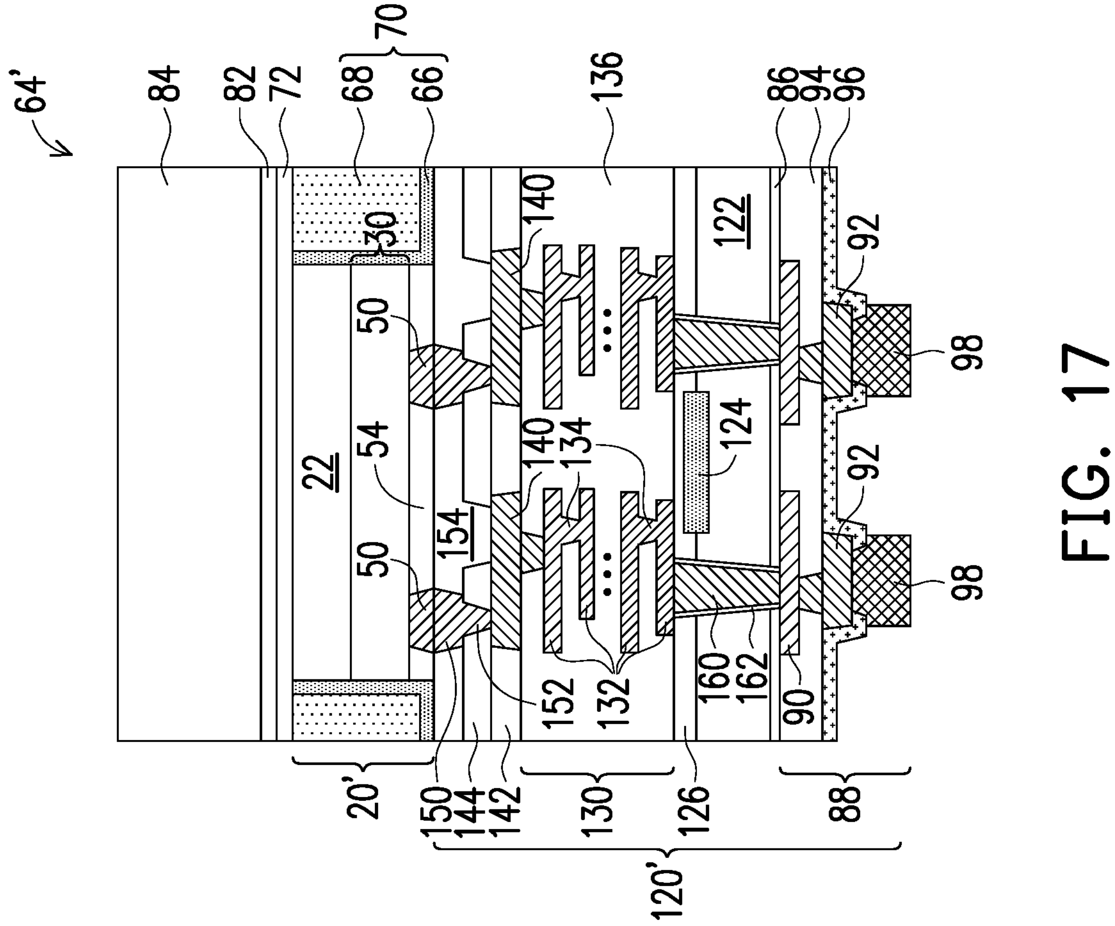
FIG. 17 illustrates the cross-sectional view of a package in accordance with alternative embodiments.

FIG. 17 illustrates package 64' formed in accordance with alternative embodiments of the present disclosure. These embodiments are similar to the embodiments as shown in FIG. 16, except that vias 152 are landed on metal pads 140, rather than on the metal pads 132. Similarly, vias 52 (FIG. 2) may also land on metal pad 40 in accordance with alternative embodiments.

FIGS. 18A, 18B, and 18C illustrate some backside interconnect structures 88 on the backside of device dies 120' and the formation processes in accordance with some embodiments. FIG. 18A illustrates a dielectric-layer-first process, in which dielectric layer 96 is formed first, and RDL 92 is formed after the formation of dielectric layer 96. FIG. 18B illustrates an RDL-first process, in which RDL 92 is formed before the formation of dielectric layer 96. FIG. 18C illustrates the same structure as shown in FIG. 16 or FIG. 17, wherein a plurality of RDLs 90 and 92, metal pads 98 and dielectric layers 94 and 96 are formed as parts of backside interconnect structure 88.

Figures 19, 20:
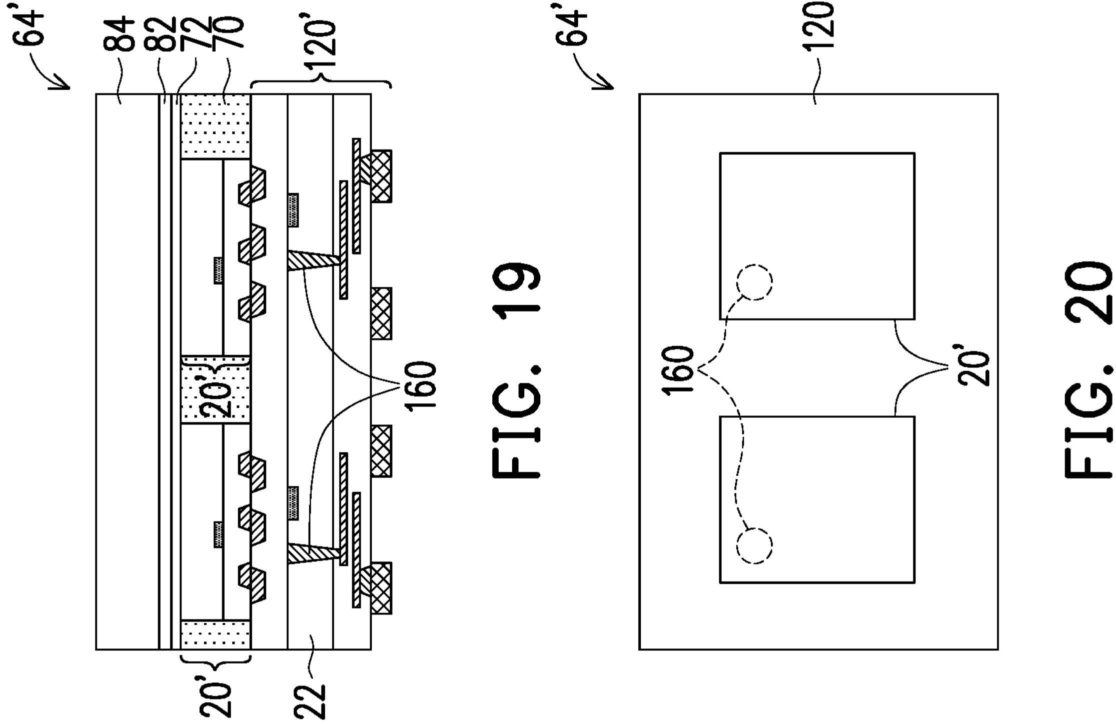
FIGS. 19 through 22 illustrate the cross-sectional views and top views of some packages in accordance with some embodiments.

FIGS. 19 and 20 illustrate a schematic cross-sectional view and a schematic top-view of package 64'. In accordance with some embodiments, through-vias 160 are vertically aligned to (top) device dies 20', with no through-vias 160 being vertically aligned to and overlapped by gap-filling regions 70.

Figures 21, 22:
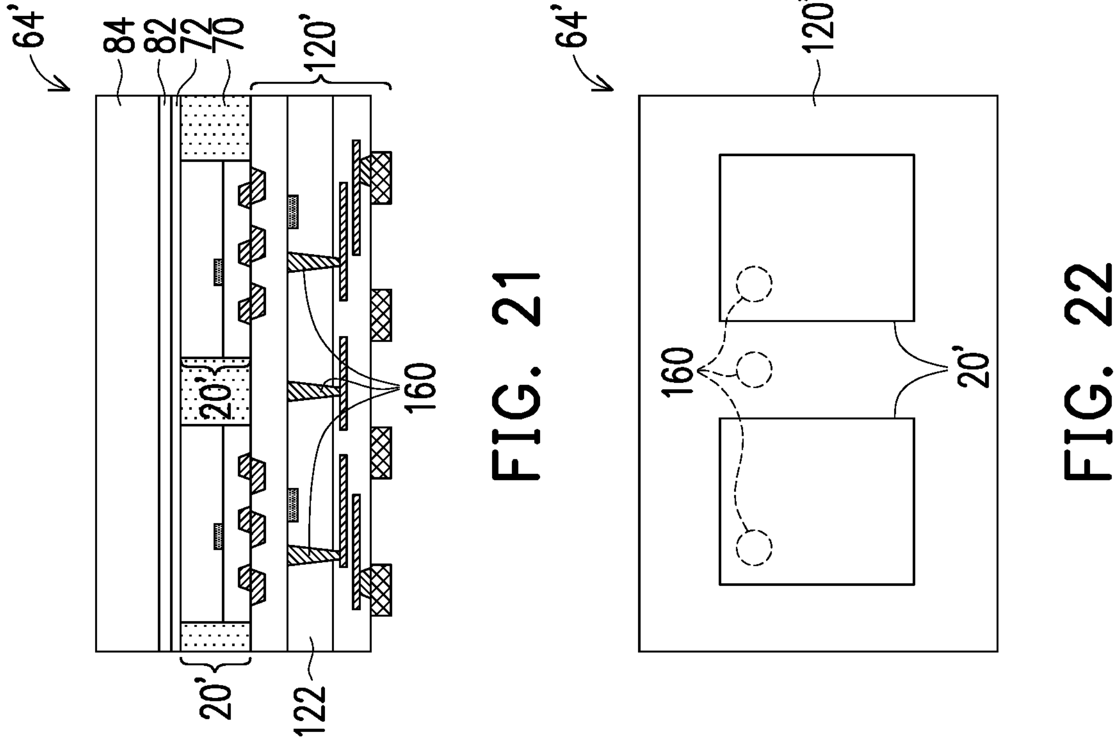

FIGS. 21 and 22 illustrate a schematic cross-sectional view and a schematic top-view of package 64' in accordance with alternative embodiments. Some of through-vias 160 are vertically aligned to and overlapped by (top) device dies 20', while some other through-vias 160 are vertically aligned to and overlapped by gap-filling regions 70. Accordingly, not only device dies 20' (which may be more performance-demanding than device dies 120') have smaller footprint since no through-vias are formed therein, the number of through-vias that can be formed in device dies 120' is also increased since the chip area directly underlying and overlapped by gap-filling regions 70 can also be used to form through-vias 160.

Figure 23:
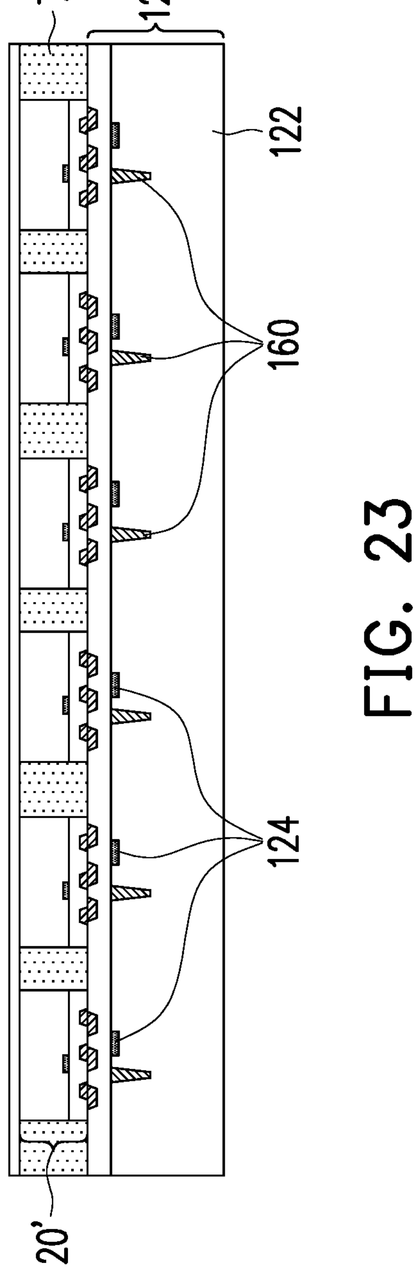
FIG. 23 illustrates the cross-sectional view of a package with more device dies and active devices in the bottom die in accordance with some embodiments.
Figure 24:
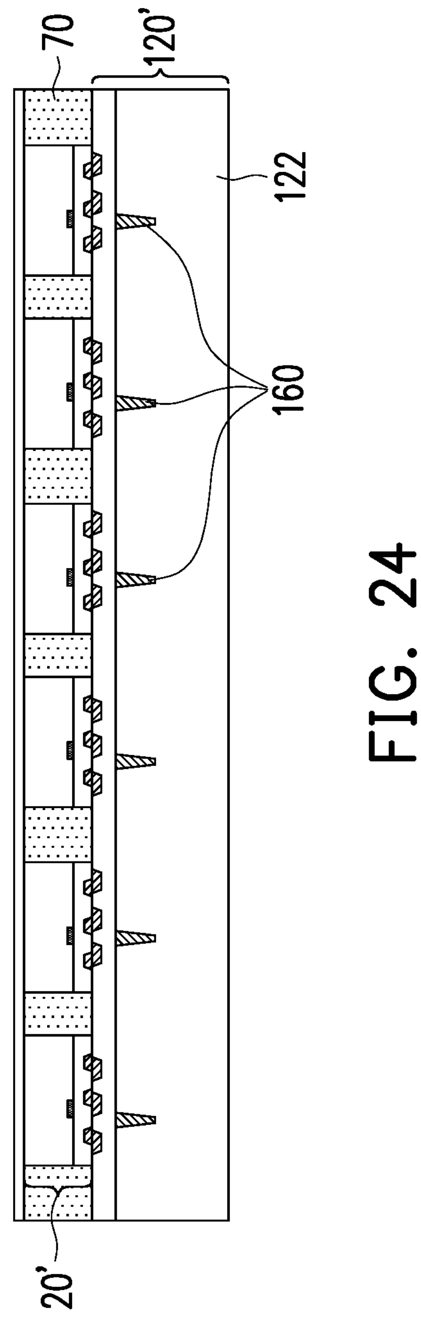
FIG. 24 illustrates the cross-sectional view of a package with more device dies and no active device in the bottom die in accordance with some embodiments.

FIGS. 23 and 24 illustrate the intermediate stages in the formation of reconstructed wafer 64 in accordance with some embodiments. In FIG. 23, device die 120' is an active device die including integrated circuit devices 124 that are active devices. In FIG. 24, device die 120' is a through-via die or a passive device die, and either no integrated circuit devices are formed, or the integrated circuit devices 124 therein include passive devices and do not include active devices.

In addition, FIGS. 23 and 24 illustrate that a device die 120' may be bonded with more devices dies, for example, three, four, five, six, or more device dies.

Figure 25:
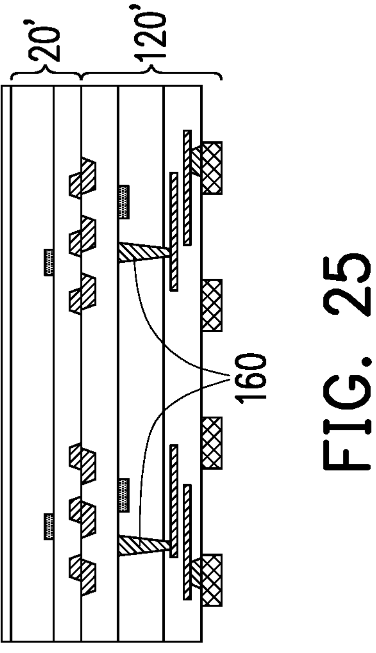
FIG. 25 illustrates the cross-sectional view of a package with a single top die having a same lateral dimension as a respective bottom die in accordance with some embodiments.

FIG. 25 illustrates package 64' in accordance with alternative embodiments. These embodiments are similar to the preceding embodiments, except that each bottom device die 120' is bonded with a single top device die 20'. Accordingly, the edges of device die 120' are vertically aligned to the corresponding edges of the overlying device die 20', and the lateral dimensions (such as lengths and widths when viewed from top) of device die 120' are the same as the lateral dimensions of device die 20'.

Figures 26, 27, 28:
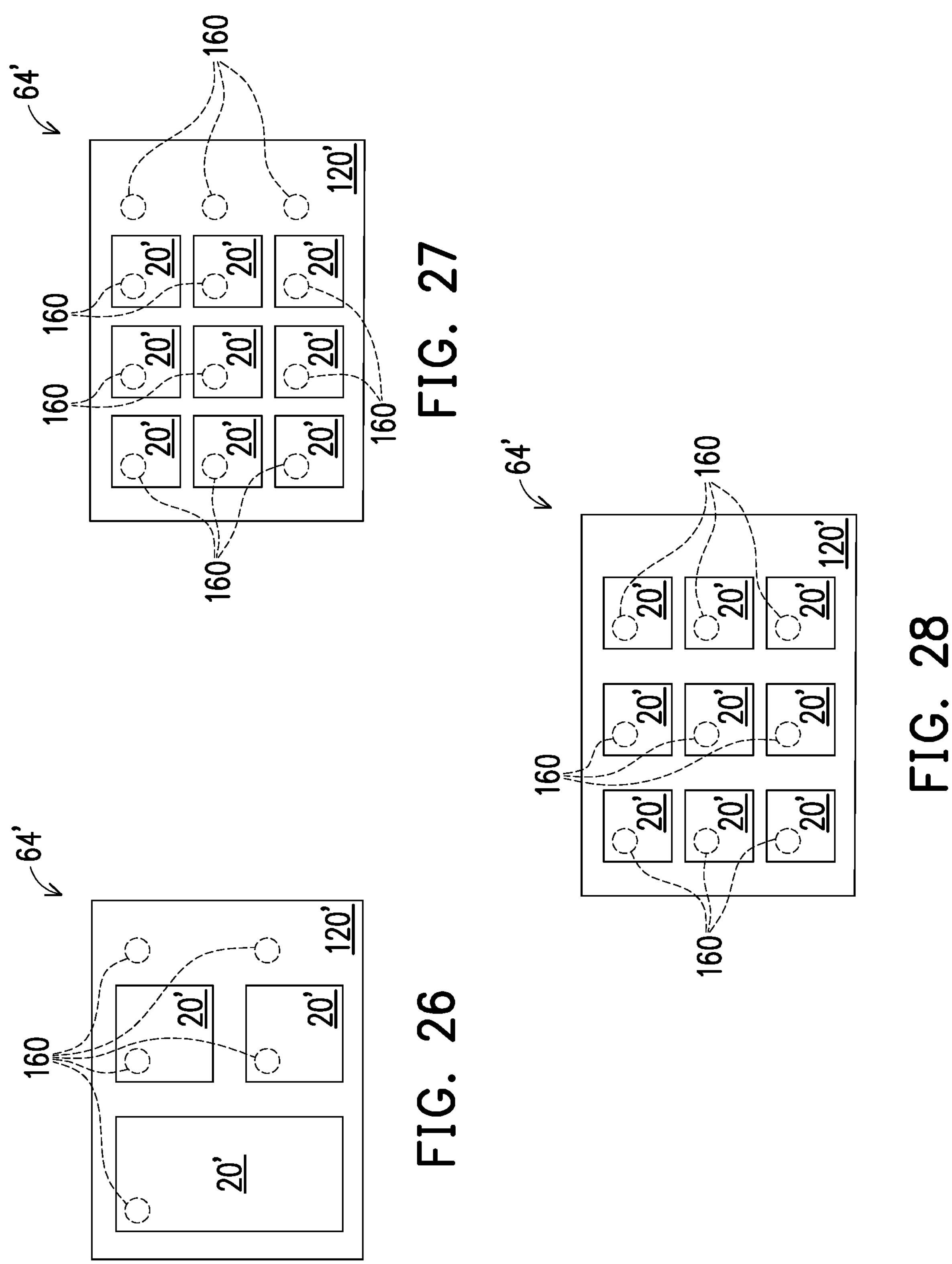
FIGS. 26 through 28 illustrate the arrangement of top dies and the respective through-vias in accordance with some embodiments.

FIGS. 26, 27, and 28 illustrate the top views of some arrangements of top dies 20' and through-vias 160 in accordance with some embodiments. In FIG. 26, the top dies 20' may have different sizes, and some or all of top dies 20' may overlap some through-vias 160. FIG. 27 illustrates that top dies 20' may form an array, and some or all of top dies 20' may overlap some through-vias 160. There may also be some through-vias 160 not overlapped by any top die 20', and are overlapped by gap-filling regions 70 (FIG. 16 or 17).

FIG. 28 illustrates an embodiment similar to the embodiment in FIG. 27, except that all through-vias 160 are overlapped by top dies 20'.

Figure 29:
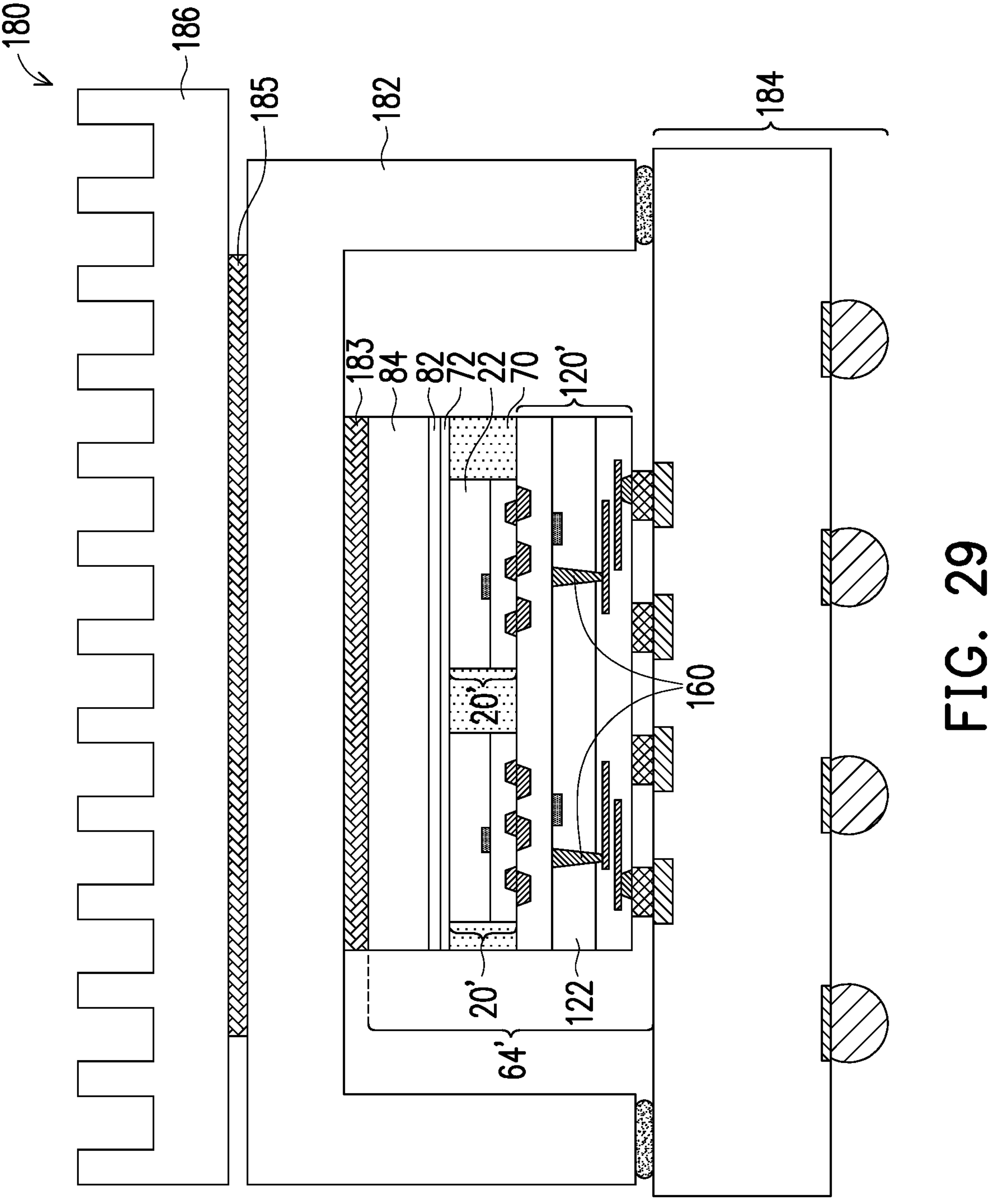
FIGS. 29 through 31 illustrate some packages in accordance with some embodiments.
Figure 30:
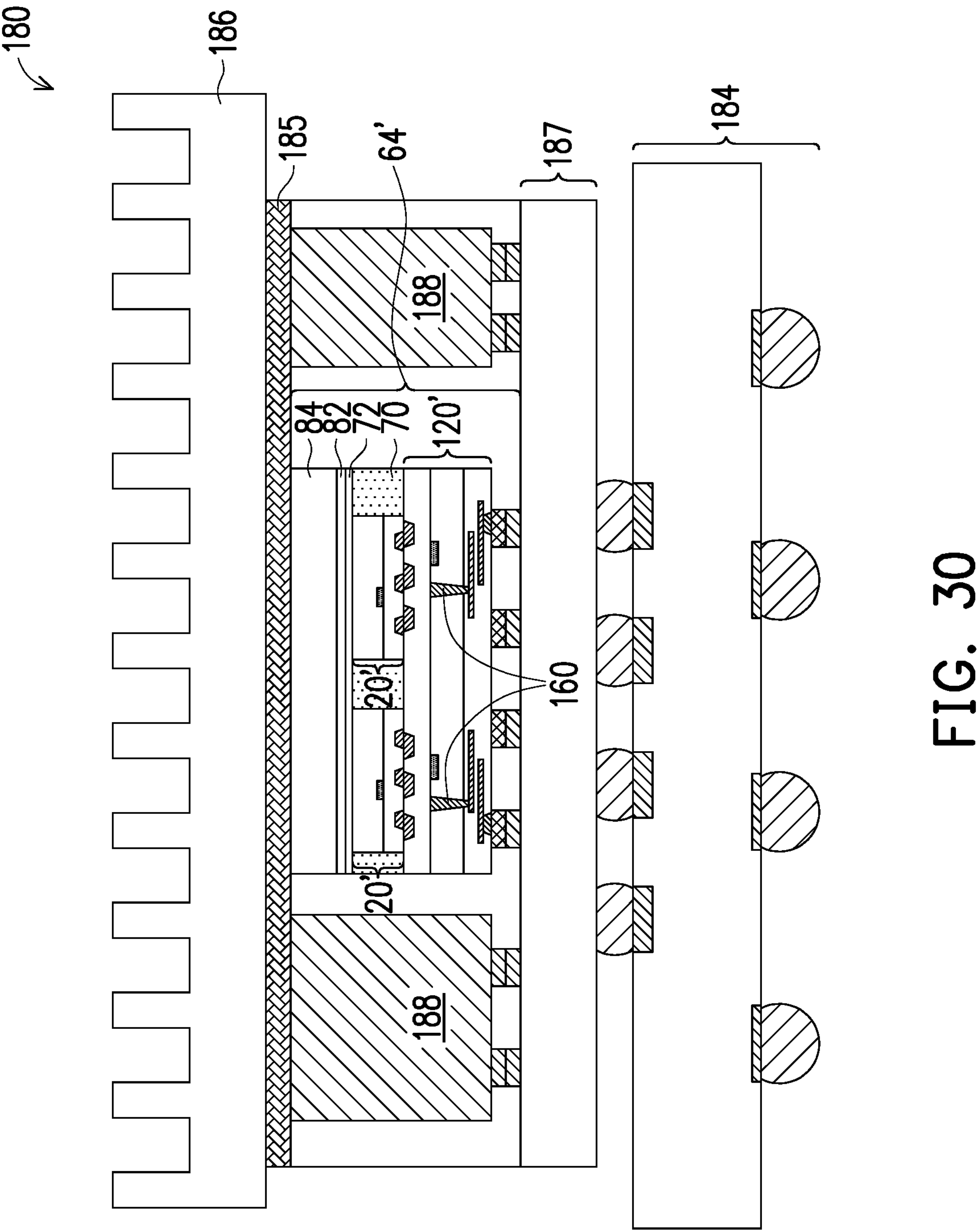
Figure 31:
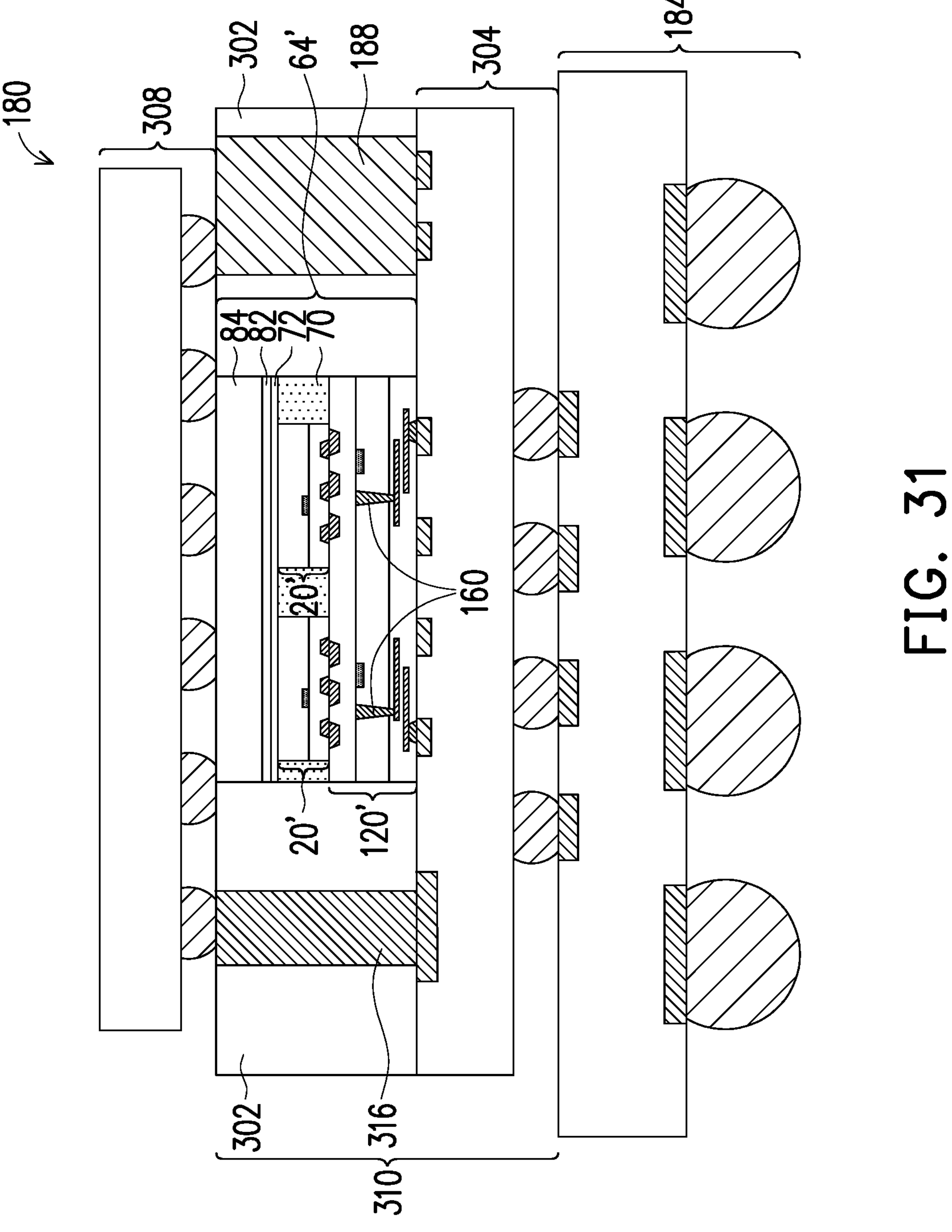

FIGS. 29 through 31 illustrate some example packages 180 formed in accordance with some embodiments. Referring to FIG. 29, package 64' is bonded to package component 184, which may be a package substrate (cored or core-less), an interposer, a package including device dies therein, or the like. Metal lid 182 may be attached to the top surface of supporting substrate 84 through thermal interface material 183. Heat sink 186 may be attached to the top surface of metal lid 182 through thermal interface material 185. Metal lid 182 and heat sink 186 may be formed of or comprises copper, aluminum, nickel, stainless steel, or the like.

FIG. 30 illustrates example package 180 including package 64' in accordance with alternative embodiments. There may be a plurality of package components 188 such as device dies, die stacks, TO dies, or the like, bonded to the same package component 187 along with package 64' to form a package through a chip-on-wafer packaging process. Package component 187 may include an interposer, a package substrate, or the like. Package component 187 is further bonded to package component 184, which may be a package substrate, a printed circuit board, or the like, to form a chip-on-wafer-on-substrate package. Heat sink 186 may be attached to the top surface of the underlying package through thermal interface material 185.

FIG. 31 illustrates example package 180 including package 64' in accordance with yet alternative embodiments. Package 64' and package component 188, which may be a chiplet (such as a passive device die), are encapsulated in encapsulant 302. Encapsulant 302 may be a molding compound, a molding underfill, or the like. Package 64' and package component 188 are bonded to interconnect structure 304, which has a fanout structure extending laterally beyond the edges of encapsulant 302 to form fanout package 310. Interconnect structure 304 may be formed directly from encapsulant 302, package 64' and package component 188, or may be pre-formed and then bonded to package 64' and package component 188. Through-vias 316 may also be formed in encapsulant 302 for interconnection. Package components 184 and 308 are bonded to the opposite sides of fanout package 310. Package component 308 may be a package, a device die, or the like.

In above-illustrated embodiments, some processes and features are discussed in accordance with some embodiments to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By bonding top dies and a corresponding bottom die through face-to-face bonding, forming through-vias in the bottom die, and forming a backside interconnect structure on the backside of the bottom die, the chip areas of the top dies are saved, and the footprint of the top dies is smaller. More through-vias can be formed in the bottom die since the portion of the bottom die overlapped by gap-filling regions may be used to form the through-vias. Also, since the major heat dissipation side is the side of the supporting substrate, the bottom die is less likely to be damaged.

In accordance with some embodiments, a method comprises bonding a first device die to a second device die through face-to-face bonding, wherein the second device die is in a device wafer; forming a gap-filling region to encircle the first device die; performing a backside-grinding process on the device wafer to reveal a first through-via in the second device die; forming a redistribution structure on a backside of the device wafer, wherein the redistribution structure is electrically connected to the first device die through the first through-via in the second device die; and bonding a supporting substrate to the first device die.

In an embodiment, the first device die comprises a semiconductor substrate, and the first device die is free from through-vias in the semiconductor substrate. In an embodiment, the supporting substrate comprises a semiconductor substrate, and the supporting substrate is free from active devices and passive devices therein. In an embodiment, the supporting substrate is comprised in a wafer, and the wafer is bonded to the first device die in a wafer-to-wafer bonding process. In an embodiment, the method further comprises performing a sawing process to saw the device wafer into a plurality of packages, wherein the first device die, the second device die, and a piece of the supporting substrate are comprised in a discrete package among the plurality of packages.

In an embodiment, the discrete package further comprises a plurality of device dies overlapping the second device die, and the plurality of device dies are arranged as an array. In an embodiment, the second device die further comprises a second through-via, wherein the first through-via is overlapped by the first device die, and the second through-via is overlapped by the gap-filling region. In an embodiment, the bonding the first device die to the second device die is performed through hybrid bonding. In an embodiment, the second device die comprises active devices. In an embodiment, the second device die comprises passive devices, and the second device die is free from active devices. In an embodiment, the supporting substrate comprises a metal plate.

In accordance with some embodiments, a package comprises a first device die comprising a first semiconductor substrate; and first active devices on a first front surface of the first semiconductor substrate; a second device die bonding to the first device die, wherein the second device die comprises a second semiconductor substrate; second active devices on a second front surface of the second semiconductor substrate, wherein the first front surface and the second front surface face each other; a first through-via penetrating through the second semiconductor substrate; and an interconnect structure on a backside of the second device die; and a supporting substrate bonding to the first device die.

In an embodiment, supporting substrate and the second device die are on opposite sides of the first device die. In an embodiment, the supporting substrate is free from active devices and passive devices therein. In an embodiment, the supporting substrate comprises a silicon substrate. In an embodiment, the first through-via comprises a wider end and a narrower end opposite the wider end, and wherein the wider end is between the narrower end and the supporting substrate. In an embodiment, the package further comprises a gap-filling dielectric material encircling the first device die; and a second through-via penetrating through the second semiconductor substrate, wherein the first device die overlaps the first through-via, and the gap-filling dielectric material overlaps the second through-via.

In accordance with some embodiments, a package comprises a first device die; a supporting substrate over and bonding to the first device die, wherein the supporting substrate is free from active devices and passive devices therein; a thermal interface material; a metal feature over and attached to the supporting substrate through the thermal interface material; and a second device die underlying and bonding to the first device die, wherein the second device die comprises a through-via therein; and a backside interconnect structure underlying and connected to the through-via. In an embodiment, the supporting substrate comprises a semiconductor substrate, and wherein the metal feature comprises a metal cap or a heat sink. In an embodiment, the through-via comprises a wider end and a narrower end opposite the wider end, and wherein the wider end is between the narrower end and the supporting substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

bonding a first device die to a second device die through face-to-face bonding, wherein the second device die is in a device wafer;

forming a gap-filling region to encircle the first device die;

performing a backside-grinding process on the device wafer to reveal a first through-via in the second device die;

forming a redistribution structure on a backside of the device wafer, wherein the redistribution structure is electrically connected to the first device die through the first through-via in the second device die;

bonding a supporting substrate to the first device die; and performing a sawing process to saw the device wafer into a plurality of packages, wherein the first device die, the second device die, and a piece of the supporting substrate are comprised in a discrete package among the plurality of packages.

2. The method of claim 1, wherein the first device die comprises a semiconductor substrate, and the first device die is free from through-vias in the semiconductor substrate.

3. The method of claim 1, wherein the supporting substrate comprises a semiconductor substrate, and the supporting substrate is free from active devices and passive devices therein.

4. The method of claim 1, wherein the supporting substrate is comprised in a wafer, and the wafer is bonded to the first device die in a wafer-to-wafer bonding process.

5. The method of claim 1, wherein the discrete package further comprises a plurality of device dies overlapping the second device die, and the plurality of device dies are arranged as an array.

6. The method of claim 1, wherein the second device die further comprises a second through-via, wherein the first through-via is overlapped by the first device die, and the second through-via is overlapped by the gap-filling region.

7. The method of claim 1, wherein the bonding the first device die to the second device die is performed through both of dielectric-to-dielectric bonding and metal-to-metal bonding.

8. The method of claim 1, wherein the second device die comprises active devices.

9. The method of claim 1, wherein the second device die comprises passive devices, and the second device die is free from active devices.

10. The method of claim 1, wherein the supporting substrate comprises a metal plate.

11. A method comprising:

forming a first device die comprising:

a first semiconductor substrate; and first active devices on a first front surface of the first semiconductor substrate;

bonding a second device die to the first device die, wherein the second device die comprises:

a second semiconductor substrate;

second active devices on a second front surface of the second semiconductor substrate, wherein the first front surface and the second front surface face each other;

a first through-via penetrating through the second semiconductor substrate; and an interconnect structure on a backside of the second device die; and attaching a supporting substrate to the first device die, wherein at a time after the supporting substrate is attached, the first through-via comprises a wider end and a narrower end opposite to the wider end, and wherein the wider end is between the narrower end and the supporting substrate.

12. The method of claim 11, wherein the supporting substrate and the second device die are bonded to opposite sides of the first device die.

13. The method of claim 11, wherein the supporting substrate is free from active devices and passive devices therein.

14. The method of claim 13, wherein the supporting substrate comprises a silicon substrate.

15. The method of claim 11, further comprising:

dispensing a gap-filling dielectric material encircling the first device die, wherein the second device die comprises a second through-via penetrating through the second semiconductor substrate, and wherein the first device die overlaps the first through-via, and the gap-filling dielectric material overlaps the second through-via.

16. A method comprising:

bonding a supporting substrate over a first device die, wherein the supporting substrate is free from active devices and passive devices therein;

attaching a metal feature over the supporting substrate through a thermal interface material, wherein the thermal interface material is in physical contact with the metal feature and a semiconductor substrate of the supporting substrate; and bonding a second device die underlying the first device die, wherein the second device die comprises:

a through-via therein; and a backside interconnect structure underlying and connected to the through-via.

17. The method of claim 16, wherein the metal feature comprises a metal cap or a heat sink.

18. The method of claim 16, wherein the through-via comprises a wider end and a narrower end opposite the wider end, and wherein the wider end is between the narrower end and the supporting substrate.

19. The method of claim 16, further comprising encapsulating the first device die in a dielectric gap-filling material, wherein the through-via is overlapped by the first device die, and wherein the second device die further comprises an additional through-via overlapped by the dielectric gap-filling material.

20. The method of claim 16, further comprising performing a sawing process to saw a device wafer that comprises the second device die into a plurality of packages, wherein the first device die, the second device die, and a piece of the supporting substrate are comprised in a discrete package of the plurality of packages.

* * * * *